United States Patent [19]

Shintaku et al.

[11] Patent Number: 5,219,828

[45] Date of Patent: Jun. 15, 1993

[54] METHOD FOR FABRICATING OXIDE SUPERCONDUCTING COATINGS

[75] Inventors: Hidetaka Shintaku; Hideo Nojima; Masayoshi Koba, all of Nara; Masaya Nagata, Soraku, all of Japan

[73] Assignee: Sharp Kabushiki Kaisha, Osaka, Japan

[21] Appl. No.: 769,459

[22] Filed: Oct. 1, 1991

[30] Foreign Application Priority Data

| Oct. 1, 1990 | [JP] | Japan | 2-264682 |
| Mar. 26, 1991 | [JP] | Japan | 3-060624 |
| Apr. 8, 1991 | [JP] | Japan | 3-073433 |
| Jun. 14, 1991 | [JP] | Japan | 3-143205 |

[51] Int. Cl.$^5$ .................................................. C25D 13/02
[52] U.S. Cl. ......................................... 505/1; 204/181.5; 205/224
[58] Field of Search ................... 204/181.5; 505/1; 205/224

[56] References Cited

U.S. PATENT DOCUMENTS

| 4,879,270 | 11/1989 | Maxfield et al. | 505/1 |
| 4,939,119 | 7/1990 | Iwata et al. | 505/1 |
| 4,952,557 | 8/1990 | Schmidt | 505/1 |
| 5,071,828 | 12/1991 | Greuter et al. | 505/1 |

FOREIGN PATENT DOCUMENTS

| 0293981 | 5/1988 | European Pat. Off. . |
| 0350143 | 3/1989 | European Pat. Off. . |
| 2-3191 | 10/1991 | Japan . |

OTHER PUBLICATIONS

Applied Physics Letters, vol. 55, No. 5, 31 Jul. 1989.

*Primary Examiner*—John Niebling
*Assistant Examiner*—Kishor Mayekar
*Attorney, Agent, or Firm*—Birch, Stewart, Kolasch & Birch

[57] ABSTRACT

A copper substrate is immersed into a solution in which a Y-Ba-Cu-O series oxide superconducting fine powder is dispersed into an acetone solution and an electric field is applied thereto. A coating deposited on the copper substrate by electrophoresis is sintered with high temperature in vacuum or in an inert gas atmosphere and then subjected to heat-treatment for oxygen composition ratio in an atmosphere of oxygen or air under 500° C. This method prevents occurrence of a CuO layer, which would conventionally be formed at an interface between a Y-Ba-Cu-O film and a Cu substrate disadvantageously, and moreover enables fabrication of superconducting coatings having satisfactory characteristics.

4 Claims, 21 Drawing Sheets

METHOD FOR FABRICATING OXIDE SUPERCONDUCTING COATINGS

BACKGROUND OF THE INVENTION

1. Field of the Invention

The present invention relates to methods for fabricating superconducting coatings and, more particularly, to a method for fabricating oxide superconducting coatings having a characteristic of weak bond in grain boundaries with high precision and high density by electrophoresis.

2. Description of the Prior Art

Recently, an oxide superconducting material that has a critical temperature (Tc) of liquid-nitrogen temperature 77K or more has been discovered. Oxide superconducting materials are short in coherence length of carriers and low in carrier concentration, and therefore can be easily put into weak bond in grain boundaries of crystal grains. Taking advantage of the Josephson effect of this weak bond, they are applied to magnetic sensors and optical sensors, which can sense weak energy, or logic elements and transistors, which can be controlled by small input. To progress application and development of such oxide superconducting materials, it is essential to establish techniques by which superconducting coatings can be formed or processed into desired shapes without impairing the superconducting characteristic.

The formation itself of oxide superconducting coatings can be carried out relatively easily by using a thin-film fabrication method such as sputtering, vacuum deposition (reactive deposition, molecular beam epitaxy (MBE), ion cluster beam (ICB), laser deposition), and chemical vapor-phase growth method (RF-plasma, optical CVD, organometallic chemical vapor-phase growth (MO-CVD) or by using a thick-film fabrication technique such as spray pyrolysis, screen printing, and sol gel. However, the sputtering, vacuum deposition, and MO-CVD methods, capable of fabricating high-quality thin films as they are, would result in small areas of fabricated films and moreover necessitate vacuum equipment for the fabrication, thus involving large-scale facilities. On the other hand, the spray pyrolysis, screen printing, sol gel and like methods are, although not suitable for fabricating single-crystal thin films, yet widely used for applications in which polycrystalline materials are utilized, for example, magnetic shields, wire materials, and sensors. In particular, high-temperature superconducting materials are short in coherence length and low in carrier concentration, and therefore have a feature that they may be easily made in weak bond similar to the Josephson junction when a polycrystalline film is fabricated. Taking advantage of this effect, they contribute to the realization of, for example, magnetic sensors, optical sensors, and logic elements to be realized, thus being expected for a wide variety of applications. Despite the above fact, these conventional methods such as the spray pyrolysis, screen printing, and sol gel involve complex chemical processes in film formation, having encountered difficulties in repeatability and reliability of film characteristics. Also, it has been difficult to form films on large-scale, complex-shaped substrates by these methods.

Recently, in view of these problems, a fundamental technique for forming superconducting coatings by electrophoresis has been reported (for example, Appl. Phys. Lett. 55 (1989) 492). This method is, in brief, one in which a superconducting powder dispersed in an organic solvent is deposited on a substrate biased to a negative or positive potential, and thereafter the substrate is sintered by heat treatment to form a superconducting film. This method is expected for a wide variety of applications by virtue of its capability of forming superconducting films on large-scale, complex-shaped substrates.

However, substrates for this method have been provided heretofore by using noble metals such as gold or silver that involve less reactions with high-temperature oxide superconducting materials, while other substrate materials could not afford the superconductivity. Such a limitation on the material of substrates has caused this method to be costly, making it difficult to put the method into practical applications. Moreover, the method has suffered not only from obscurities in the mechanism of fabrication but also from insufficient criteria for controlling the characteristic.

The inventors of the present application of patent have previously proposed a method that allows superconducting coatings to be formed on a copper substrate with its resistance being zero by controlling the conditions except the atmosphere for sintering, using copper as a substrate, which had previously been taken impossible (Japanese Patent Application No. 3191/1990). Disadvantageously, although a film fabricated by the method indeed becomes superconductive, its zero-resistance temperature is in the range of approximately 60 to 80K in the case of Y-Ba-Cu-O superconducting coatings, thus the resulting film characteristic being not satisfactory.

SUMMARY OF THE INVENTION

The present invention has been developed with a view to substantially solving the above described disadvantages in the formation of superconducting coatings by electrophoresis and has for its essential object to provide an improved method for fabricating superconducting coatings which allows such coatings having desired characteristics to be easily formed into desired shapes with high precision.

In order to achieve the aforementioned object, the present invention provides a method for fabricating superconducting coatings comprising the steps of: immersing a substrate having a copper electrode formed thereon into a solution in which an oxide superconducting fine powder is dispersed into an organic solvent; sintering the deposited film of the oxide superconducting fine powder formed on the electrode by electrophoresis in an atmosphere of vacuum or an inert gas; and subsequently heat-treating the result for controlling the oxygen composition ratio in oxygen or an atmosphere containing oxygen such as air. More specifically, in the method for fabricating superconducting coatings of the invention in which a fine powder of superconducting material dispersed into an organic solvent is deposited on a substrate biased to a negative potential, copper is used as a conductive substrate and heat treatment for fixing the electrodeposited fine powder of superconducting material is carried out in such a way that the atmosphere is vacuum or an inert gas for temperatures at which the superconducting coating crystallizes while it is oxygen or air for temperatures at which oxygen is entrapped into the superconducting coating, so that the fine powder of superconducting material will be bound to each other and that a CuO layer formed at the interface with the substrate will not cause any adverse influences.

It is at around 900° C. that oxide high-temperature superconducting materials are crystallized by solid-phase reactions, at which temperature the surface of copper of the substrate is oxidized to form a copper oxide (CuO) layer. The CuO, once formed, will make a flux of oxide high-temperature superconducting material that serves to lower the fusing point. Due to this, the oxide high-temperature superconducting material fuses at the substrate interface to react with Cu, which it can be assumed is the primary cause for deterioration of the superconducting characteristic. . (Jpn. J. Appl. Phys. 29 (1990) L1655). However, the temperature is around 450° C. at which the oxide high-temperature superconducting material entraps oxygen during heat-treatment; if treatments for a temperature range in excess of 500° C. are all carried out in vacuum or an inert gas and moreover oxygen or air is introduced in at a temperature below 500° C., the formation of the CuO layer decreases and the deterioration of superconductivity is prevented, thus allowing the oxide high-temperature superconducting coatings having excellent characteristics to be formed on the copper substrate. As a result of this, it is possible to fabricate superconducting coatings having desired characteristics with high precision in desired shapes.

In consequence, whereas the conventional film formation by electrophoresis has been such that, although superconducting coatings can selectively be formed into desired shapes, the characteristics could not be easily controlled and moreover costly gold or silver was used for substrates, copper is used in the present invention as a substrate material and the atmosphere for heat treatment is controlled thereby to avoid any influence of the CuO that is formed at the interface, whereby the characteristics can be controlled and the superconducting coatings having excellent characteristics can be fabricated.

The present invention also provides a method for fabricating oxide superconducting coatings in which an insulating substrate having a conductive film of a specified pattern formed on its surface is immersed into an organic solvent into which an oxide superconducting fine powder is dispersed, the oxide superconducting fine powder is deposited on the conductive film held at a negative potential, and thereafter the result is heat-treated, wherein a silver thin film is used as the conductive film on the insulating substrate. There are provided bias electrodes to a positive potential in parallel on the proximate periphery of the conductive film biased to a negative potential, wherein a film thinned to submicrons or so composed of silver (Ag) is used at least for the conductive film to be biased to a negative potential.

Conventional superconducting coatings by electrophoresis in which some heat-resisting metal such as copper is used as the conductive thin film would have a result that the conductive thin film remains in parallel after use. The copper conductive film, when the deposited superconducting coating is sintered, would have a layer of copper oxide formed on its surface, the copper oxide acting as a flux of superconducting material to cause the characteristic of the formed superconducting coating to be deteriorated.

The conductive thin film of silver of the present invention as described above will not cause the superconducting material to be deteriorated even when the silver is heated to high temperatures, and moreover the silver-thin film will flocculate into fine particles by a heat treatment at a temperature over a specific level, thus resulting in a composition that will not electrically affect the superconducting coating.

Furthermore, according to the method of film formation of the present invention, in the deposition of the superconducting coating in which a patterned conductive thin film of silver is biased to a negative potential and immersed into an organic solvent into which fine particles of superconducting material are dispersed, since there are provided electrodes to be biased to a positive potential in the form of conductive thin film also composed of patterned silver or other metal and they are disposed at a fixed interval on the proximate periphery of the electrodes biased to a negative potential, a concentrated electric field is formed without intruding between positive and negative electrodes, thus allowing high-precision superconducting fine powder to be deposited.

Yet furthermore, since the conductive thin film flocculates into isolated minute spherical shapes by sintering at a temperature ranging from 880° C. to 935° C., the formed superconducting coating will not involve normally conductive parallel circuits and the coating will be of ceramic construction composed of fine particles, thus providing excellent characteristics of magnetoresistance and optical response due to crystal grain boundaries.

Moreover, in the method for fabricating oxide superconducting coatings according to the present invention, the conductive thin film to be biased to a positive potential is provided at a fixed interval in proximity to the conductive thin film to be biased to a negative potential to deposit the superconducting coating on a piece of insulating substrate, and the polarity of the bias potential is inverted, whereby the superconducting coating is deposited also onto the conductive thin film having been biased to a positive potential. This allows an efficient formation of a superconducting coating on an insulating substrate. Further, since the electric field for electrodeposition of electrophoresis due to the insulating substrate on which the conductive thin film is formed concentrates between proximate conductive films to form an intensive potential gradient, the electric field will not intrude between the electrodes and therefore it is possible to effect a deposition of superconducting fine powder matching the pattern of the conductive thin film biased to a negative potential.

In consequence, according to the present invention, in the formation of superconducting coatings in which two patterned conductive thin films formed on an insulating substrate in proximity to each other at a fixed interval in parallel are used as electrodes and immersed into an organic solvent into which a superconducting fine powder is dispersed and the superconducting fine powder is deposited on the electrode biased to a negative potential by electrodeposition of electrophoresis, wherein a superconducting coating is formed on the two electrodes by switching the polarity of the voltage that is biased to the two electrodes. Since the two proximate conductive films are used and thus the electric field biased between the thin films forms so intensive an electric field gradient that the electric field will not intrude between the electrodes, a superconducting coating pattern with high precision can be obtained and moreover the same can be formed with high density making the best use of insulating substrate surface.

The present invention further provides a method for fabricating oxide superconducting coatings in which, in the state that a substrate having a pair of conductive films attached thereon so as to be juxtaposed apart from each other is immersed into a solvent into which the material of a superconducting substance is dispersed, one of the pair of conductive films is held at a negative potential and the other positive and the superconducting substance is deposited on the conductive film on the negative potential side by electrophoresis, wherein the conductive film on the negative potential side is composed of silver while the conductive film on the positive potential side is composed of copper, gold, or platinum.

Due to the fact that the conductive film on the negative potential side is composed of silver, the superconducting coating formed on the conductive film on the negative potential side will never decrease in its superconducting characteristic, i.e. critical temperature or critical current density. Therefore, the operating temperature and operating current of the formed superconducting film can be set to ones higher than has been conventionally, thus allowing the magnetoresistance of the external magnetic field to be developed more efficiently. Moreover, since the conductive film on the positive potential side is composed of copper, gold, or platinum, there will occur no migration from the positive to negative potential side (which would happen when the conductive film on the positive potential side is composed of silver). As a result, superconducting coatings with high precision and high density can be formed.

In addition, when sintering is carried out after deposition of the superconducting coating, the superconducting coating of silver flocculates, no longer forming a conductive path. In this case, since the superconducting coating is of ceramic structure composed of fine particles, the magnetoresistance and optical response due to crystal grain boundaries can be obtained efficiently.

The present invention still further provides a method for fabricating oxide superconducting coatings in which a conductive film having a specified pattern formed on an insulating substrate is immersed into an organic solvent into which a superconducting fine powder is dispersed and held at a negative potential and the superconducting fine powder is deposited on the superconducting film, wherein a fine powder of silver oxide is added into the organic solvent into which the superconducting fine powder is dispersed.

In this method, a patterned conductive film, for example, a copper thin film is biased to a negative potential and immersed into the organic solvent into which the fine particles of the superconducting material are dispersed, allowing a superconducting coating to be deposited on the conductive film. In this process, since the fine powder of silver oxide has been added into the organic solvent, a superconducting film to which silver is added can be formed. The superconducting film to which silver is added has a ceramic structure composed of fine particles, thus allowing the magnetoresistance and optical response due to crystal grain boundaries to be obtained efficiently.

In addition, since the electrode to be biased to a positive potential is also provided at a fixed interval on the proximate periphery of the patterned conductive film such that the electric field concentrates without intruding between the positive and negative electrodes, superconducting fine particles and silver oxide fine particles can be deposited with high precision. This is followed by sintering, whereby the conductive film oxidizes or flocculates, causing a conductive path to be no longer formed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 17 is a view showing the magnetic characteristic data of the aforementioned oxide superconducting coating;

DETAILED DESCRIPTION OF THE PREFERRED EMBODIMENTS

Now the present invention is described in detail below with reference to the accompanying drawings.

(First embodiment)

In a first embodiment of the present invention, $Y_1Ba_2Cu_3O_{7-x}$ superconducting fine powder for a basic material was made by the solid reaction method. First, $Y_2O_3$, $BaCO_3$, and $CuO$ powder materials (purity: 99.99%) were weighed so as to obtain a Y - Ba - Cu element ratio of 1:2:3, and subjected to mixing, pulverization, and dispersion, followed by heat treatment in air at 900° C. for 5 hours. Then, after further mixing, pulverization, and dispersion, the result was formed into a pellet (diameter: 9 mm, thickness: 1 mm) at a pressure of 1500 kg/cm². This pellet was heat-treated in air at 950° C. for 5 hours, and again subjected to pulverization, mixing, and dispersion into a powder. The resulting powder was further heat-treated at 950° C. for 3 hours. Finally, the powder was made to pass through a mesh, thus preparing a material for coating fabrication. The grain diameter of the resulting $Y Ba_2Cu_3O_{7-x}$ fine powder was approximately 1 μm on the average.

Figure 2:
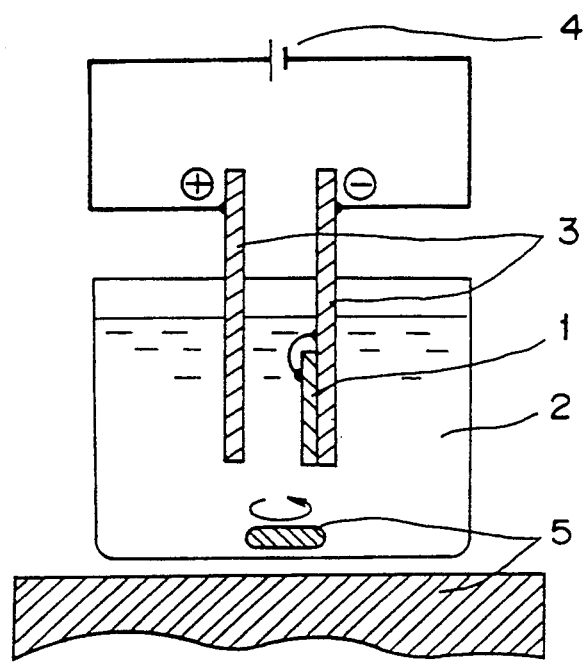
FIG. 2 is a sectional view showing the outline of a film deposition apparatus by electrophoresis.

The resulting $Y_1Ba_2Cu_3O_{7-x}$ fine powder was dispersed into acetone to prepare a solution 2 (as shown in FIG. 2). The concentration of the powder was 2.5 g of powder to 25 ml of acetone.

A schematic view of the apparatus used for the fabrication is shown in FIG. 2. As shown in the figure, conductive electrodes 3 were immersed into the solution 2 and an electric field was applied between the electrodes 3 by a constant-voltage source 4. Using the electrode 3 of copper on the positive potential side, a copper plate was provided as a substrate 1 on the negative potential side. The electric field applied between the electrodes 3 was 200 V/cm and kept in this state for approx. 10 min., thereby causing a coating to be deposited on the copper substrate 1. During the deposition, a magnetic stirrer 5 was made to continuously stir the solution 2 so that the superconducting fine powder dispersed thereinto would not be precipitated.

Figure 1:
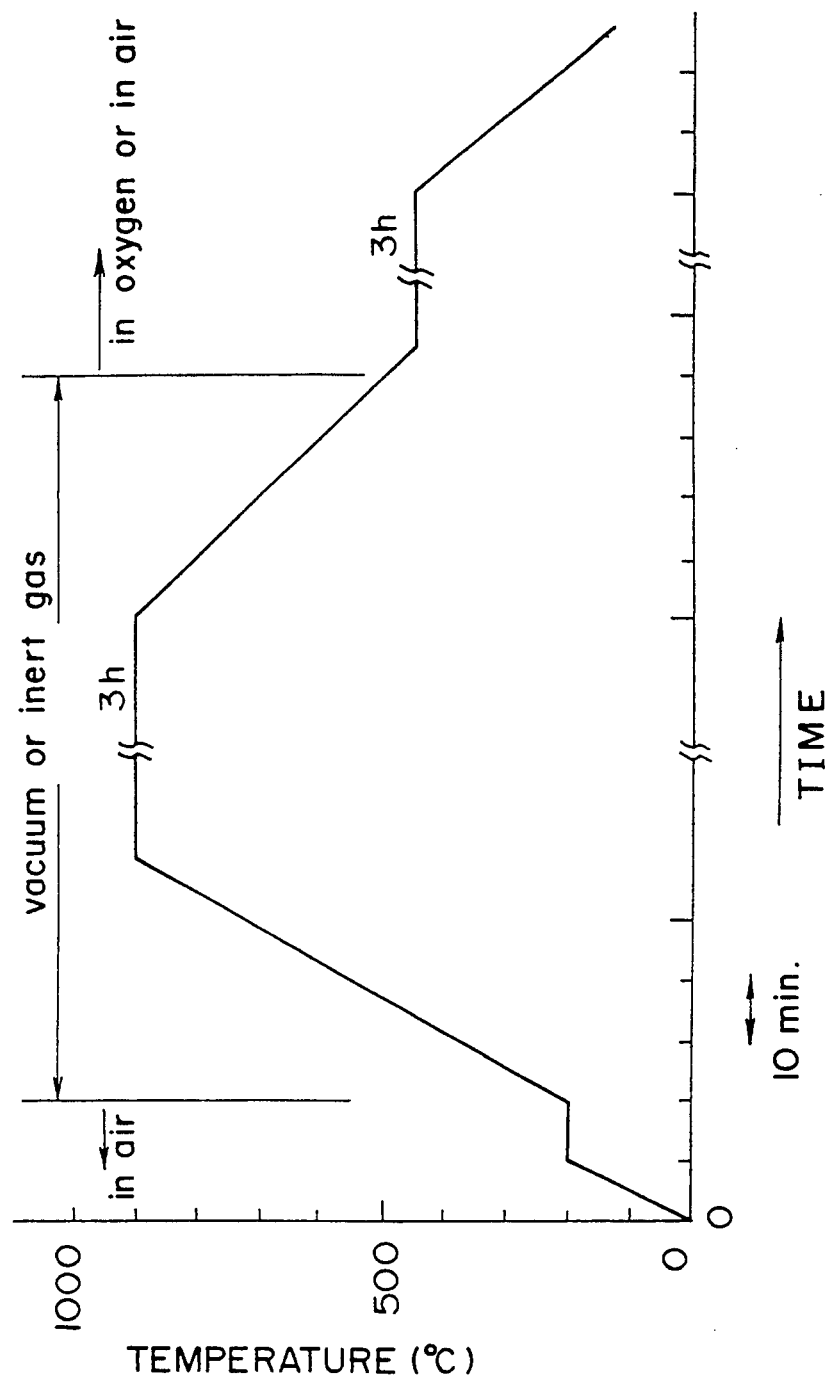
FIG. 1 is a view for explaining the heat treatment process of a superconducting fine powder by electrophoresis.
Figure 3:
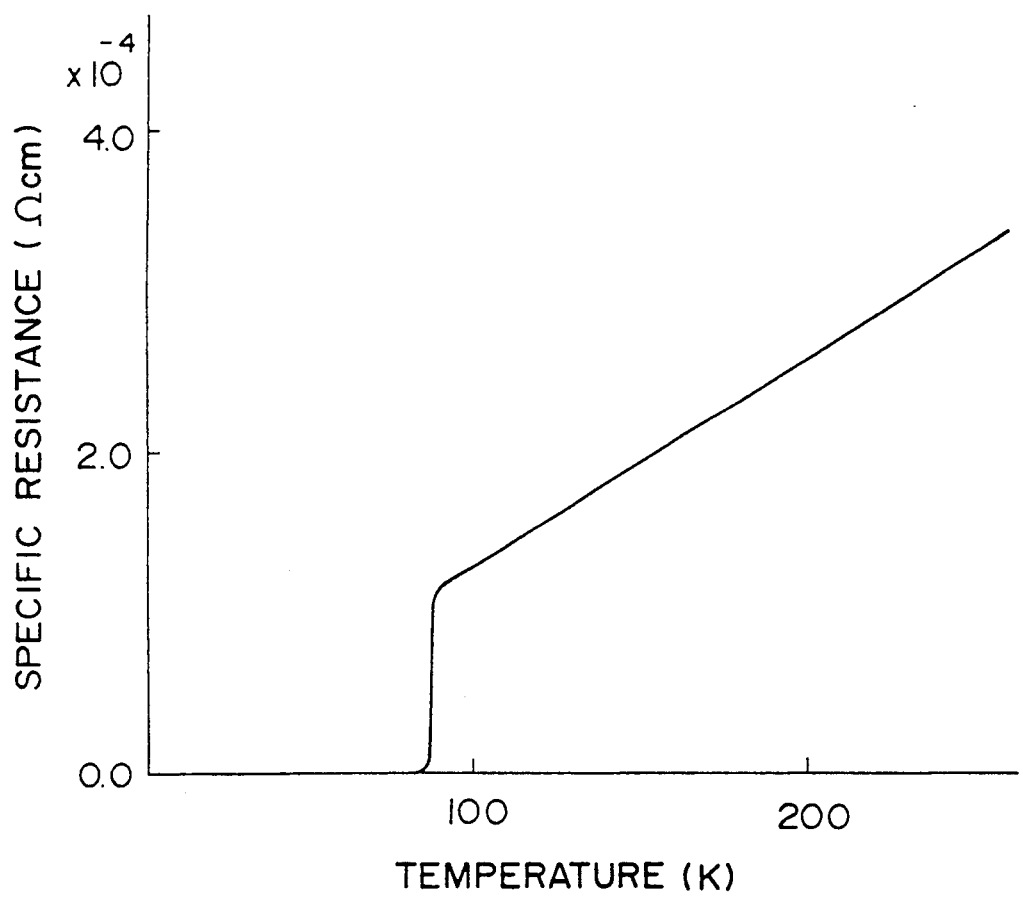
FIG. 3 is a view showing the temperature dependency of electrical resistance of oxide superconducting coatings formed according to the first to eleventh embodiments.

The copper substrate on which the coating had been deposited was heat-treated by a temperature process as shown in FIG. 1. With the temperature raised from room temperature to 200° C., to fully vaporize the acetone, the substrate was kept as it was for 10 min. and thereafter the inside of a reaction furnace was made into vacuum state by a vacuum pump and, with the temperature raised to 900° C. in that state, the substrate was kept as it was for 3 hours. Subsequently, with the temperature lowered, oxygen was introduced into the reaction furnace at 500° C., and the substrate was temporarily kept at 450° C. for 3 hours and then cooled to room temperature. The thickness of the resulting coating was approx. 50 μm. The temperature dependency of electrical resistance of this coating was measured. The measurement of electrical resistance was done by forming Ti as current/voltage electrodes by vacuum deposition and connecting lead wires with silver paste in a standard 4-terminal method. The value of the current to be flown through the sample was 0.1 mA. The result is shown in FIG. 3. It was established that the electrical resistance of the prepared coating begins to rapidly decrease at 96K (the case is the same with the following embodiments), and becomes zero at 93K.

(Second embodiment)

In the same manner as in the first embodiment, coating deposition was made on a copper substrate. For heat treatment, after making a vacuum state at 200° C., the atmosphere was substituted by argon gas and the same sintering heat-treatment as in the first embodiment was done. After the argon gas was temporarily drawn out from the reaction furnace using a vacuum pump at 500° C., oxygen was introduced into the reaction furnace, and the same heat treatment as in the first embodiment was continued. As a result, a superconducting coating was obtained the electrical resistance of which begins to decrease at 96K and becomes zero at 92K.

(Third embodiment)

The argon gas used for the atmosphere in the second embodiment was substituted by nitrogen gas and the same experiment as in the second embodiment was carried out. As a result, as in the second embodiment, a superconducting coating was obtained the electrical resistance of which begins to decrease at 96K and becomes zero 92K.

(Fourth embodiment)

With air introduced at 500° C. instead of oxygen that was introduced in the first, second, and third embodiments, an experiment was carried out. As a result of preparing a plurality of (not less than 10) samples, superconducting coatings were obtained the electrical resistance of which in either case becomes zero at 90K or more.

(Fifth embodiment)

In the same coating preparation as in the first embodiment, an experiment was carried out with oxygen introduced at a temperature of 600° C. As a result, the prepared coating proved that its electrical resistance begins to decrease at 96K but becomes zero at 82K.

(Sixth embodiment)

In the same coating preparation as in the first embodiment, an experiment was carried out with oxygen introduced at a temperature of 700° C. As a result, the prepared coating proved that its electrical resistance begins to decrease at 96K but becomes zero at 76K.

(Seventh embodiment)

In the same coating preparation as in the first embodiment, an experiment was carried out with oxygen introduced at a temperature of 800° C. As a result, the prepared coating proved that its electrical resistance begins to decrease at 96K but becomes zero at 68K.

(Eighth embodiment)

In the same coating preparation as in the first embodiment, an experiment was carried out with oxygen introduced at a temperature of 400° C. In this case, however, the retention of the substrate was done not at 450° C. for 3 hours but at 400° C. for 3 hours immediately after the introduction of oxygen, and thereafter cooled. As a result, the prepared coating proved that its electrical resistance begins to decrease at 96K and becomes zero at 88K.

(Ninth embodiment)

In the same coating preparation as in the first embodiment, an experiment was carried out with oxygen introduced at a temperature of 300° C. In this case, however, the retention of the substrate was done not at 450° C. for 3 hours but at 300° C. for 3 hours immediately after the introduction of oxygen, and thereafter cooled. As a result, the prepared coating proved that its electrical resistance begins to decrease at 96K and becomes zero at 86K.

(Tenth embodiment)

In the same coating preparation as in the first embodiment, an experiment was carried out with oxygen introduced at a temperature of 200° C. In this case, however, the retention of the substrate was done not at 450° C. for 3 hours but at 200° C. for 3 hours immediately after the introduction of oxygen, and thereafter cooled. As a result, the prepared coating proved that its electrical resistance begins to decrease at 96K and becomes zero at 50K or lower.

From the ten types of embodiments described above, it was shown that an oxide superconducting coating deposited on a copper substrate by electrophoresis vary to a substantial extent in the characteristic of its superconducting coating depending on the atmosphere and temperature in the heat-treatment process.

(Eleventh embodiment: Comparative example)

In the same processes as in the first embodiment except that the heat-treatment was carried out thoroughly in the atmosphere of air, a superconducting coating was prepared. The electrical resistance of the prepared coating proved to begin to decrease at 94K and become zero at 66K.

Although the methods for fabricating oxide superconducting coatings according to the present invention were described in the above-described embodiments, the present invention is not limited thereto and it is possible to obtain the effects of the present invention also when the voltage applied between the electrodes, the dispersion concentration for the solution, and the deposition time in the coating deposition by electrophoresis are controlled as the case may be.

Furthermore, although the superconducting fine powder used in the above embodiments was provided by using $Y_1Ba_2Cu_3O_{7-x}$ made by the solid reaction method, the preparation of superconducting fine powder is not limited thereto and the effect of the present invention can be obtained also by available other methods such as use of $Y_1Ba_2Cu_3O_{7-x}$ fine powder by the coprecipitation method. Further, although a copper plate was used as the substrate in the embodiments of the present invention, the effect can be obtained also by optionally using a substrate formed by deposition or plating or the like of a copper thin film.

As apparent from the foregoing, the above embodiments are such that superconducting coatings having an excellent characteristic can be prepared by controlling the atmosphere and temperature and the like in the heat-treatment in which the oxide superconducting fine powder coating deposited on the copper electrodes is sintered and the oxygen composition ratio is prepared. Accordingly, it has been made possible to prepare superconducting coatings, which can be large-sized or complex-shaped, by electrophoresis with a simple apparatus on an inexpensive copper substrate.

(Twelfth embodiment)

Next, the superconducting fine powder used in the electrodeposition of electrophoresis in the twelfth embodiment is described. The superconducting fine powder has a composition of $Y_1Ba_2Cu_3O_{7-x}$, what is called Y-series high-temperature oxide electrically conductive material, which was prepared in the following manner. After $Y_2O_3$, $BaCO_3$, and $CuO$ of high purities (purities: 99.99% or more) were weighed so as to obtain the Y - Ba - Cu element ratio of 1:2:3, as each element was contained in each material, and sufficiently mixed, they were heat-treated at 900° C. for 5 hours to synthesize an oxide. The synthesized oxide was pulverized and mixed, and the resulting powder was formed into a pellet (diameter: 9 mm, thickness: 1 mm) by applying a pressure of 1500 Kg/cm² by a press machine. The formed pellet was heat-treated in air at 950° C. for 5 hours and moreover again pulverized into a fine powder, followed by an additional heat-treatment in air at 950° C. for 3 hours. The fine powder prepared as above was selected in grain diameter through a screen mesh to make an oxide superconducting fine powder used for this embodiment, the average grain diameter of the fine powder being controlled so as to be approx. 1 μm on the average. The resulting Y-series oxide superconducting fine powder was dispersed into acetone used as an organic solvent. This dispersion solution 102 (shown in FIG. 6) had a dispersion ratio of 0.5 g of the superconducting fine powder to 40 ml of acetone.

Figure 5:
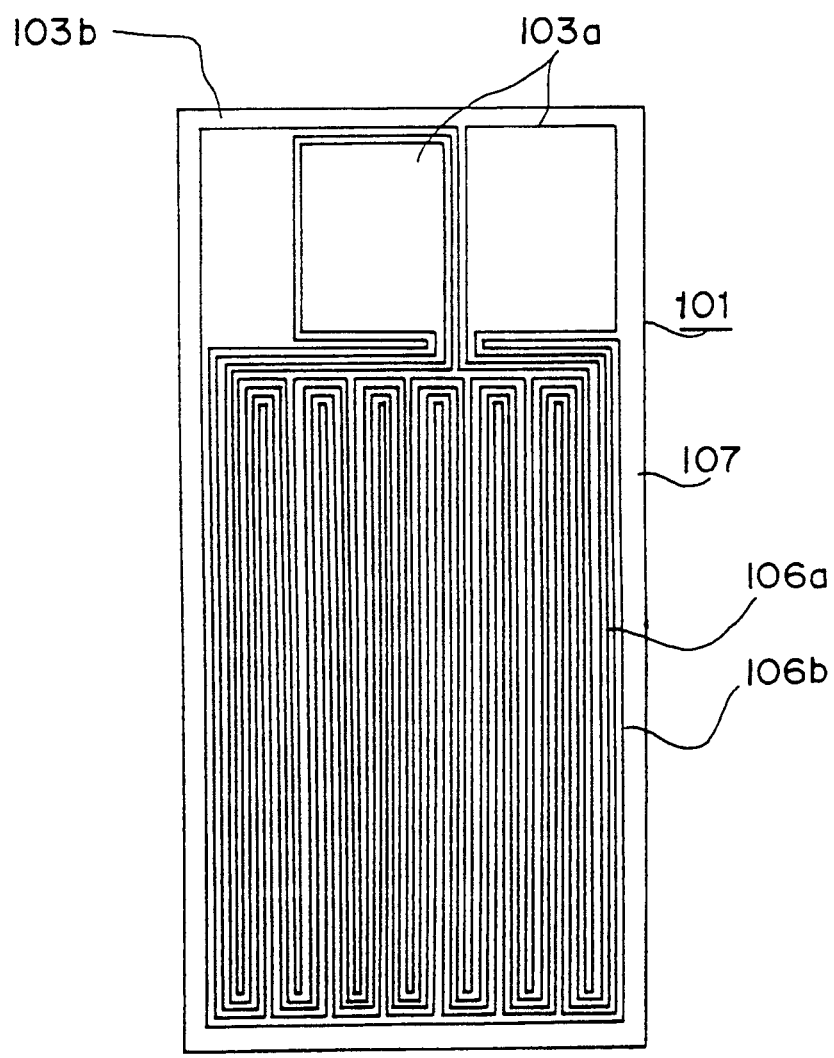
FIG. 5 is a plan view showing the pattern of a silver thin-film electrode used for deposition of superconducting file particles.

Referring next to a substrate 101 used in the twelfth embodiment, the substrate 101, as its plan view is shown in FIG. 5, has a conductive thin-film electrode 106a of silver (Ag) made into a pattern of superconducting coating to be formed on the surface of a YSZ insulating substrate 107, which is zirconia ($ZrO_2$) stabilized by yttrium (Y), and a conductive thin-film electrode 106b of the same material spaced apart from the foregoing. To each electrode 106a, 106b there was provided a conductive thin-film electrode pad 103a and 103b, respectively. The thin-film electrodes 106a, 106b and pads 103a, 103b were formed by simultaneously patterning 200 nm thick Ag thin films vacuum deposited by electron beam heating using the lift-off method. In addition, both the electrode line widths of the thin-film electrodes 106a, 106b and the spacing between the electrodes 106a, 106b were such a fine pattern as much as 50 μm.

Figure 6:
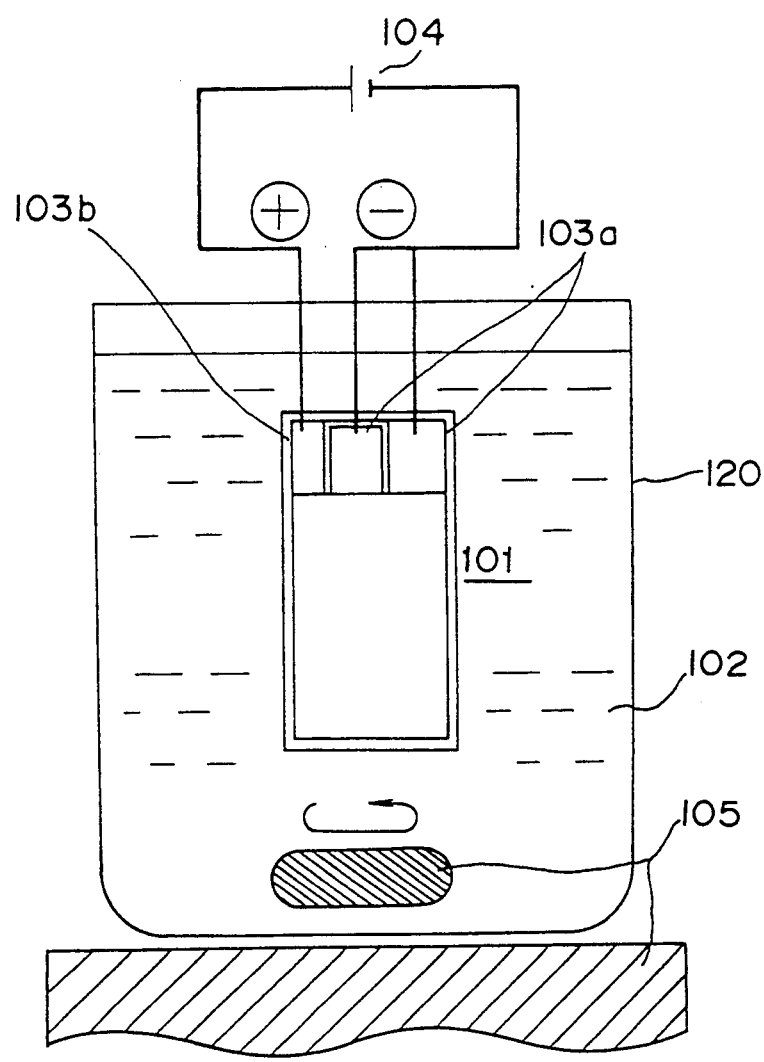
FIG. 6 is a sectional view showing the outline of a deposited film forming apparatus by electrophoresis.

FIG. 6 shows the outline of the apparatus for electrodepositing superconducting fine powder by electrophoresis incorporating the dispersion solution 102 and the substrate 101 prepared as above. In the case of FIG. 6, the dispersion solution 102 was poured into a bath 120 mounted to a magnetic stirrer 105. Then a substrate 101 on which lead wires were connected to the conductive thin-film patterns 103a, 103 b (minute electrodes 106a, 106b are omitted in the illustration) was immersed into the dispersion solution 102 in the bath 120. The lead wires connected to the patterns 103a, 103b were connected to the electrode terminals of a DC constant voltage source 104. After the above preparation of the electrophoresis apparatus, the magnetic stirrer 105 was put into operation so as to make the superconducting fine powder in the dispersion solution 102 uniformly dispersed. In this state, first the substrate 101 was connected to the DC constant voltage source 104 whose voltage was set to 100 V so as to make the pad 103a to a negative potential and the pad 103b to positive, and kept as it was for 20 seconds, thereby allowing the superconducting fine powder dispersed in acetone to be deposited on the conductive thin-film electrode 16a and the pad 103a by electrophoresis. The substrate 101, having the superconducting fine powder deposited on the conductive thin films as above, was heat-treated in air at 920° C. for 3 hours thereby to sinter the superconducting fine powder. This was followed by a heat treatment including the steps of controlling the oxygen composition ratio by holding the substrate 101 at 450° C. for 3 hours and thereafter gradually cooling it to room temperature, thereby preparing an oxide superconducting coating. The thickness of the oxide superconducting coating formed by the above conditions was 50 μm. Moreover, a high-precision superconducting coating could be formed in accordance with the patterns of the conductive thin-film electrodes 106a, 106b, which were of fine patterns.

Figure 7:
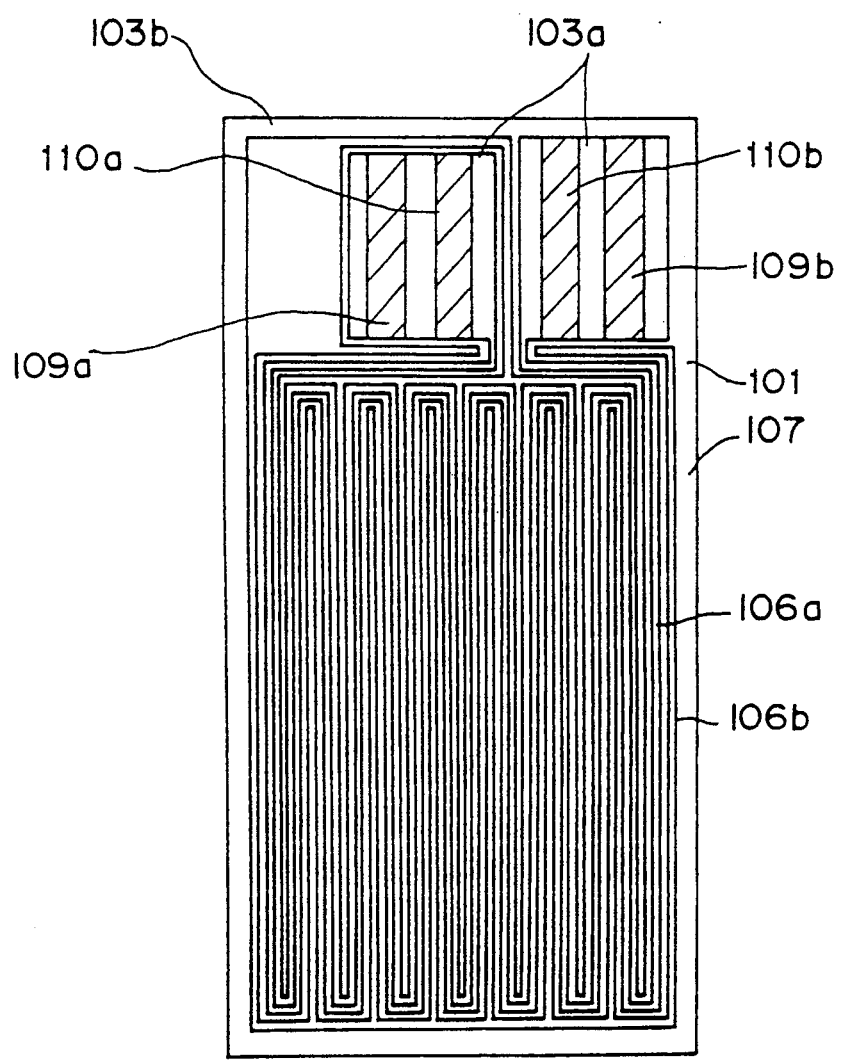
FIG. 7 is a plan view showing a magnetic reluctance device formed with the superconducting coating on a substrate.
Figure 8:
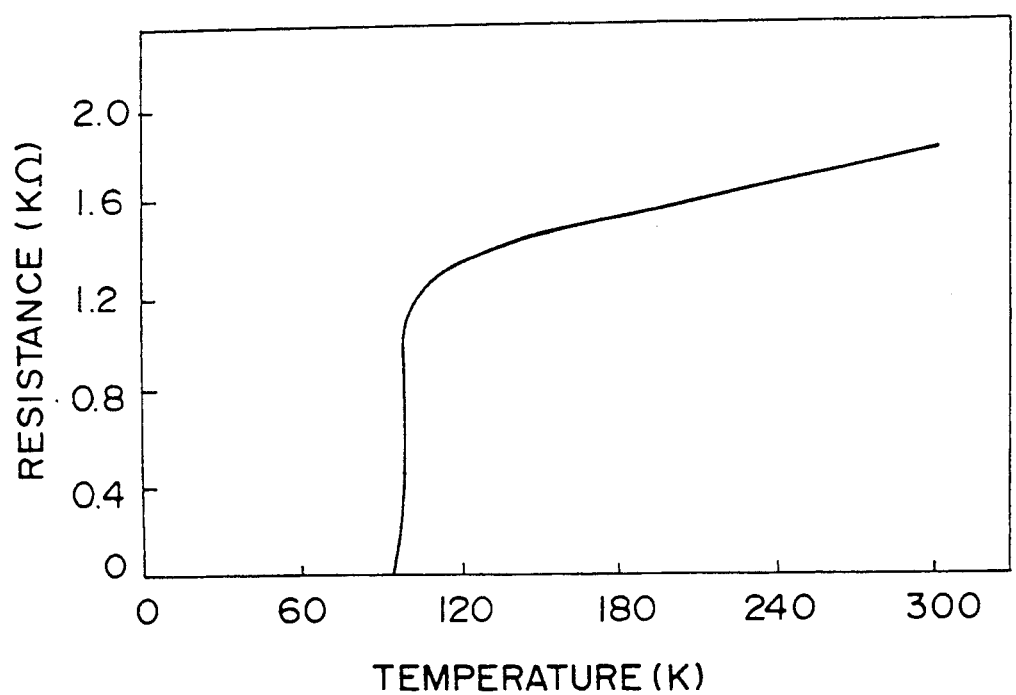
FIG. 8 is a view showing the temperature dependency of electrical resistance of the oxide superconducting coating formed according to the twelfth embodiment.

To the superconducting coating prepared as above, as shown in FIG. 7, on the pad 103a there were formed current electrodes 109a, 10-9b, voltage electrodes 110a, 110b, and a connecting portion 111 for superconducting coating by a Ti vacuum deposition method using a metal mask. Ag pasted measuring lead wires were connected to these Ti thin-film electrodes 109, 110 for connecting lead wires. The temperature dependency of electrical resistance values of the oxide superconducting coating prepared by a standard 4-terminal method using the four lead wires was measured and the result is shown in FIG. 8. In the figure, the horizontal axis represents temperature (K) and the vertical axis represents electrical resistance in its ratio to the value for 300K. As understood from FIG. 8, the superconducting coating prepared in this embodiment proved that the critical temperature is 85K at which its electrical resistance becomes zero.

Figure 9:
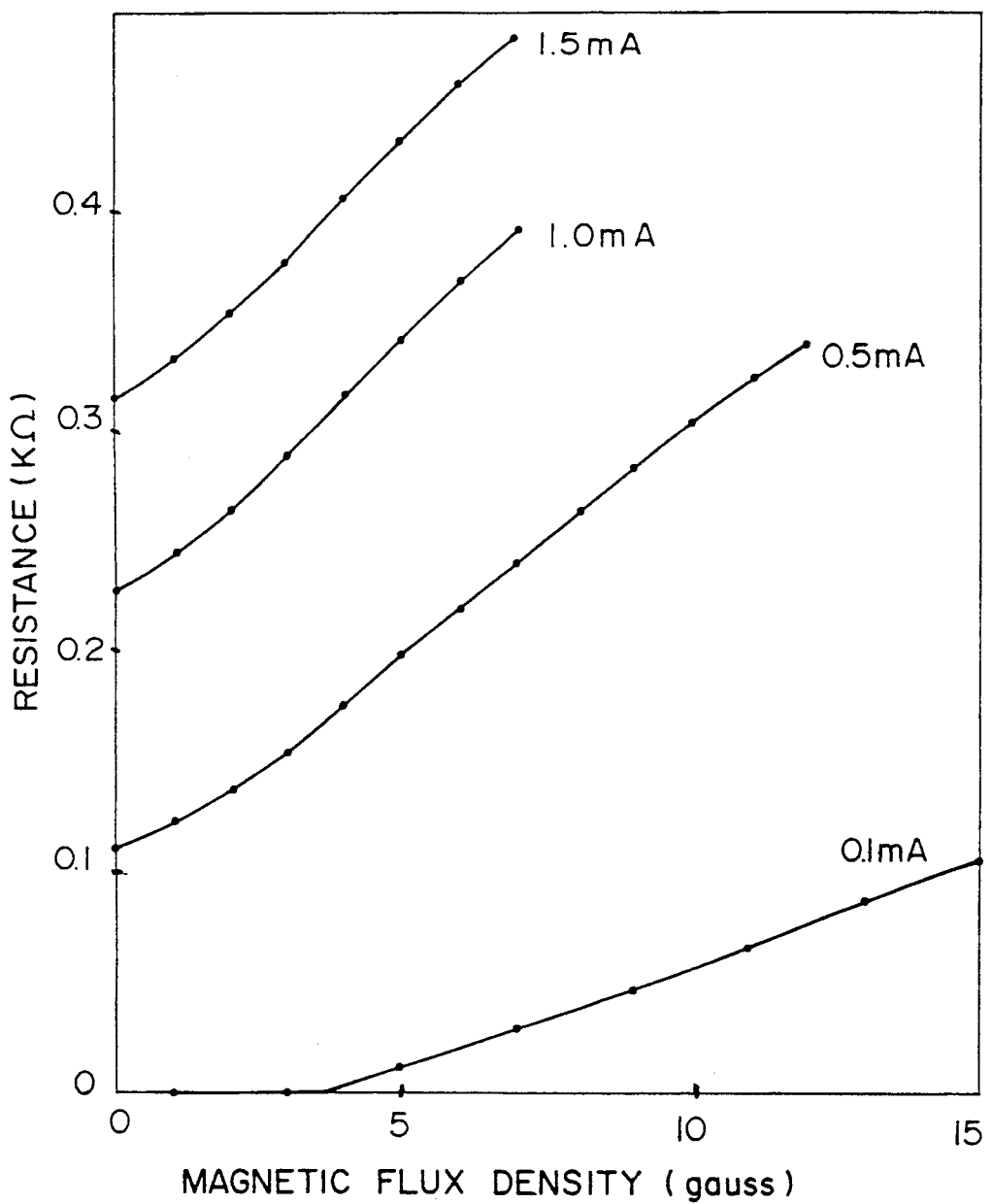
FIG. 9 is a view showing the sensitivity resulting when the bias current is varied in the superconducting magnetic reluctance device formed according to the twelfth embodiment.

It was also found that the resulting superconducting coating is of precision shape in accordance with the conductive thin film formed on the substrate, and further detailed examination has shown that in the silver thin film on which the superconducting coating was formed due to its negative potential, there were no conductive path left. As a result, the resistance variation due to the magnetoresistance of superconducting coating could be detected with high efficiency. In contrast, the silver of the conductive thin film made at a positive potential had flocculated into a size of tens of μm. With respect to a magnetic reluctance device of superconducting coating prepared as above, its sensitivity curve obtained when the bias current was varied is shown in FIG. 9. As shown in FIG. 9, it was found that the oxide superconducting magnetic reluctance device of precision pattern prepared in the present embodiment has a characteristic of a remarkably high sensitivity and at the same time there was no great variation in sensitivity characteristic to variation in the bias current (ratio of variation in the device resistance to variation in applied magnetic field). The above fact may permit to assume that there exists a large extent of characteristic distribution among numerous weak bonds of grain boundaries of the particles that form the oxide superconducting coating int he present embodiment, and that it is possible to form a magnetic reluctance device that allows a wide range of magnetic strength to be measured.

Measurement was made on superconducting coatings prepared with the same conditions as above but only the annealing temperature changed to 880° C., 900° C., and 935° C. The results are collectively shown in FIG. 4. In each case, the silver thin film as a conductive electrode flocculated and had no conductive path left, allowing resistance variation to be developed efficiently. Moreover, its critical temperature $T_{c, end}$ was at high level as much as 90K, providing a wide temperature range for use of the device made with the oxide superconducting coating, while its critical current density was also at proper level such as to allow any magnetic reluctance variation due to superconducting magnetoresistance to be picked up as a larger amount of voltage variation.

Figure 4:
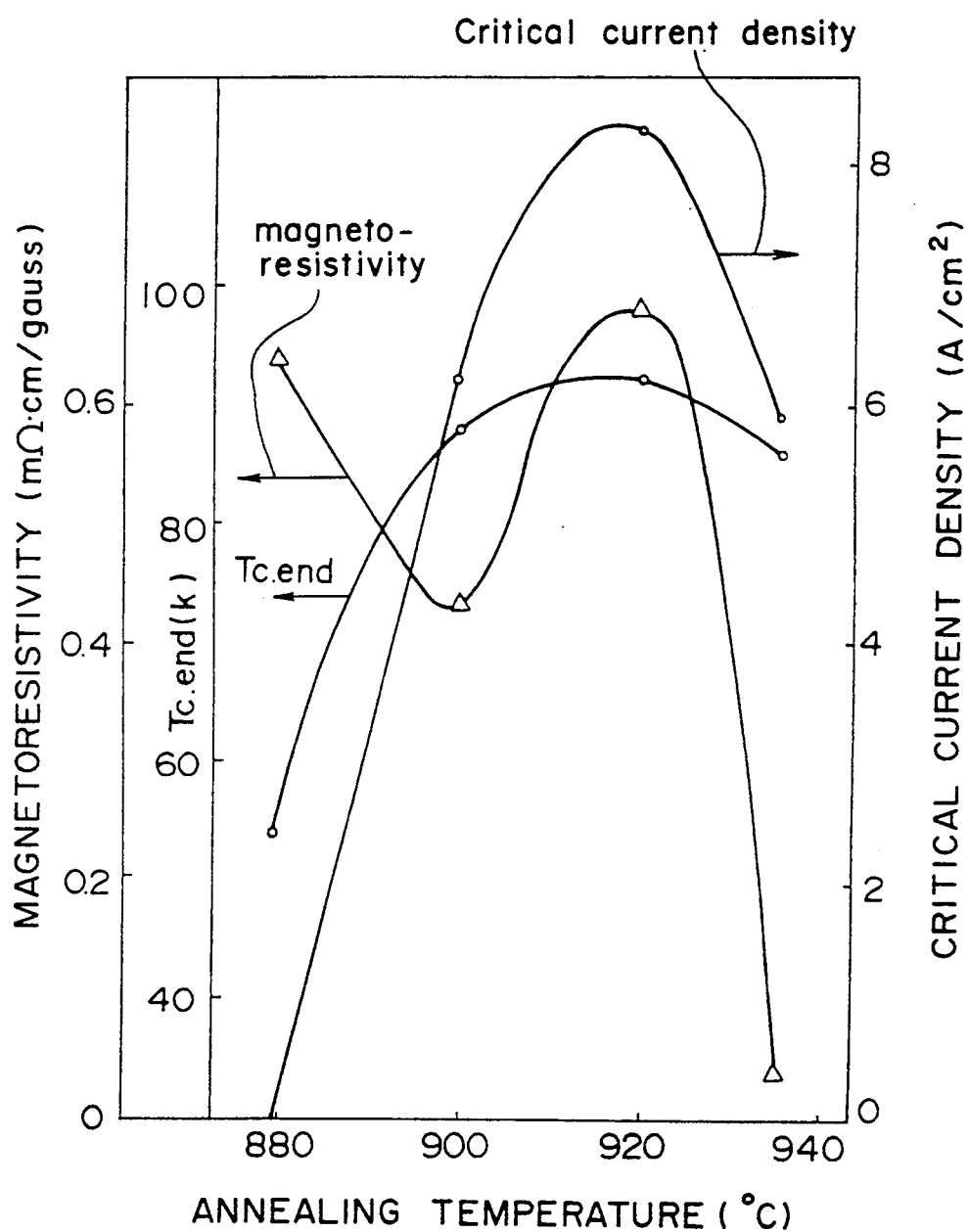
FIG. 4 is a view showing the annealing temperature dependency of various characteristics of a oxide superconducting coating formed according to the twelfth embodiment of the present invention.

FIG. 4 collectively shows the results of the superconducting characteristic and magnetic characteristic for all the cases above described. It was shown that the critical temperature $T_{c, end}$ reaches the 90K level at a temperature of 900° C. to 935° C., the highest at 920° C. The critical current density also proved to reach the highest value, 8.3 A/cm$^2$ at 920° C. Further, the superconducting coatings were compared with one another in their specific reluctances, which are values standardized by the shape of superconducting materials. As a result, they showed high specific reluctances at 920° C. or 880° C. However, the two types of superconducting coatings are different in the superconducting characteristic; that is, those annealed at 880° C. have a superconducting characteristic that the resistance is high even in a zero magnetic field and involve a large amount of output, thus resulting in a little more complicated detector circuits than in the former.

As the conditions for preparing oxide superconducting coatings of the present invention have been described referring to the twelfth embodiment up to now, the present invention is so arranged that, to develop the magnetoresistance due to grain boundaries to a great extent, silver is adopted as the conductive thin film material on which superconducting fine powder is deposited, and annealing temperature is used as the temperature at which the silver thin film flocculates and the superconducting coatings having a large magnetoresistance are formed. The present invention is not limited to embodiments, and it is permissible to properly control the conditions such as electrode pattern, the method for preparing superconducting fine powder, strength of electric field applied between the electrodes, which is a condition for depositing the superconducting fine powder by electrophoresis, and concentration and depositing time and other conditions of the fine powder in the dispersion solution, so that the resulting oxide superconducting coatings will have characteristics matching any intended usage. Furthermore, the superconducting fine powder to be used is also not limited to the fine powder of $Y_1Ba_2Cu_3O_{7-x}$ composition prepared by the solid reaction method in the embodiments, but may be one prepared by the coprecipitation method or spraying method, for example. In addition, the material for the insulating substrate may be MgO, SrTiO$_3$ and the like without being limited only to YSZ. As shown above, embodiments modified or changed within the scope that allows the effect of the present invention to be obtained should be construed as being included in the scope of the invention.

By the electrophoresis method according to the twelfth embodiment of the present invention, it is possible to make a superconducting coating having a great effect of weak bond in grain boundaries of crystal fine particles due to a ceramic high-temperature superconducting material and moreover having a specified shape with high precision.

The superconducting coating made in the above-described manner has an improved superconductivity due to the fact that the silver thin film used for electric field bias in electrophoresis is made to flocculate into fine particles, thus providing superconducting electronic devices having excellent characteristics in applications to fabrication of magnetic sensors and optical sensors, or switching devices and the like.

(Thirteenth embodiment)

Referring next to the superconducting fine powder used in the electrodeposition of electrophoresis in the thirteenth embodiment of the present invention, this superconducting fine powder has a composition of $Y_1Ba_2Cu_3O_{7-x}$, what is called Y-series high-temperature oxide superconducting material. It was made by the following manner.

$Y_2O_3$, $BaCO_3$, and $CuO$ powder materials having high purities (purity: 99.99% or more) were weighed so as to obtain a Y - Ba - Cu element ratio of 1:2:3, as each element was contained in each material, and after being mixed sufficiently, heat-treated in air at 900° C. for 5 hours, thereby synthesizing an oxide. The resulting oxide was successively subjected to pulverization and mixing, and thereafter the resulting powder was formed into a pellet (diameter: 9 mm, thickness: 1 mm) by applying a pressure of 1500 kg/cm$^2$ with a press machine. The formed pellet was heat-treated in air at 950° C. for 5 hours, and after being pulverized again into a fine powder, subjected to heat-treatment in air at 950° C. for 3 hours. The fine powder prepared as above was made to pass through a screen mesh to select grain diameters, thus making an oxide superconducting fine powder used in the embodiment. In this case, the grain diameter of the resulting fine powder was controlled so as to be approximately 1 $\mu$m on the average.

The Y-series oxide superconducting fine powder prepared in the above manner was dispersed into acetone used as an organic solvent. This dispersion solution 202 (shown in FIG. 10) was prepared in a ratio of 1.0 g of the superconducting fine powder to 2.5 ml of acetone.

Figure 11:
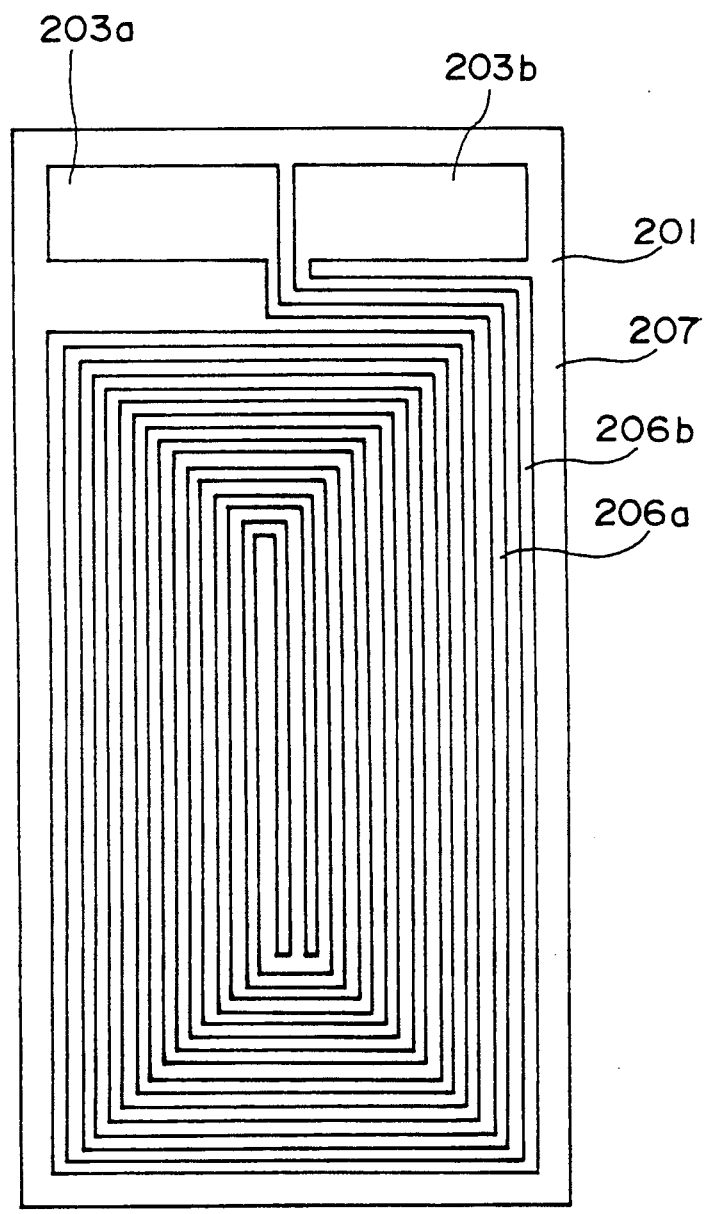
FIG. 11 is a plan view showing a substrate used for deposition.

Next, the substrate 201 used in the thirteenth embodiment is described. The substrate 201, as its plan view is shown in FIG. 11, has a conductive thin-film electrode 206a of silver (Ag) made into a pattern of superconducting coating to be formed on the surface of a YSZ insulating substrate 207, which is zirconia ($ZrO_2$) stabilized by yttrium (Y), and a conductive thin-film electrode 206b of the same material spaced apart from the foregoing. To each electrode 206a, 206b there were provided conductive thin-film electrode pads 203a and 203b, respectively. The thin film electrodes 206a, 206b and pads 203a, 203b were formed by simultaneously patterning Ag thin films vacuum deposited by electron beam heating using the lift-off method.

In addition, both the electrode line widths of the thin film electrodes 206a, 206b and the spacing between the electrodes 206a, 206b were such a fine pattern for oxide superconducting substances as much as 50 $\mu$m.

Figure 10:
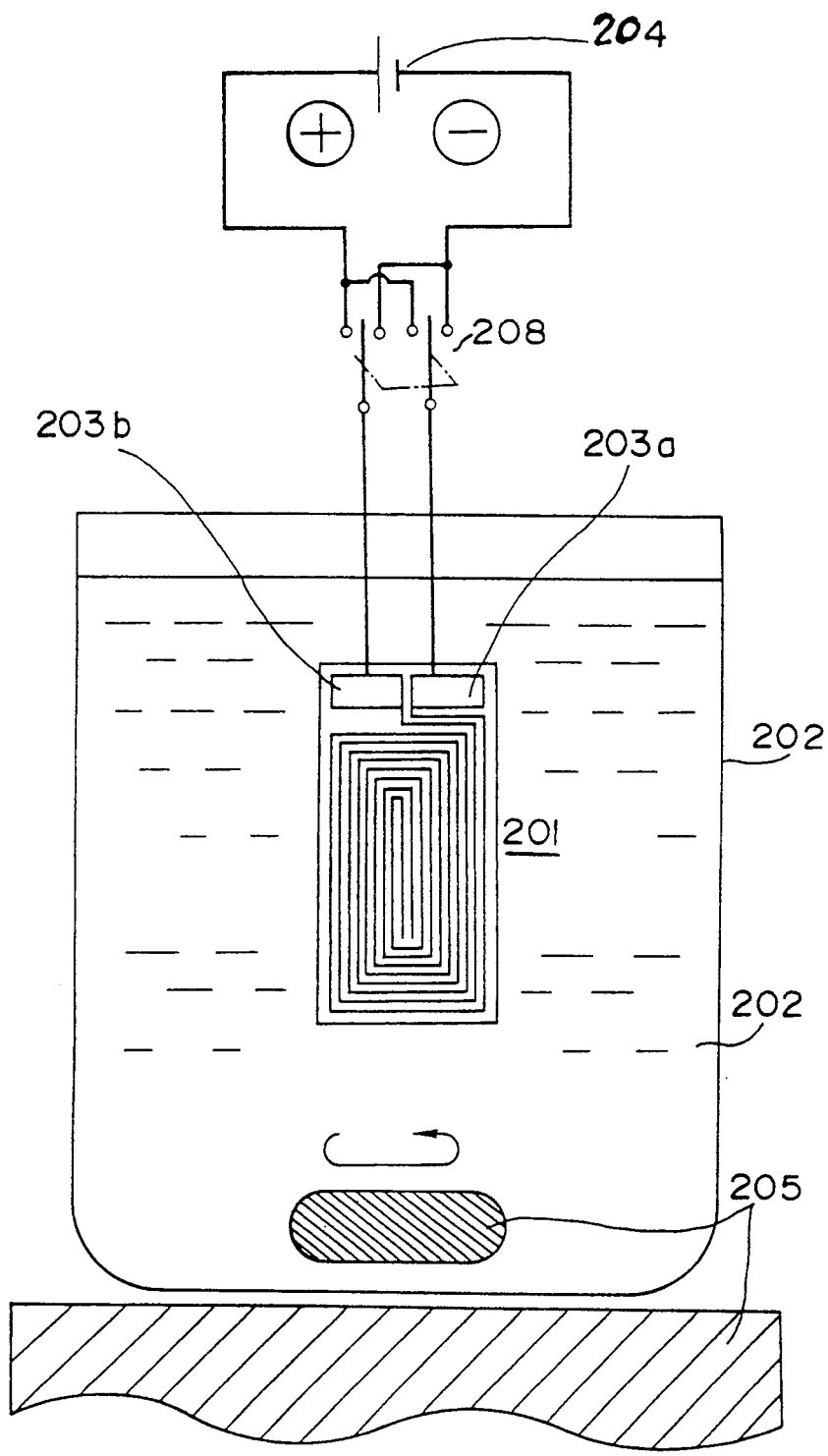
FIG. 10 is a sectional view showing the outline of a film deposition apparatus by electrophoresis.

The apparatus for depositing the superconducting fine powder by electrophoresis using the dispersion solution 202 and the substrate 201 prepared in the above manner are outlined in FIG. 10. Referring to FIG. 10, the aforementioned dispersion solution 202 was poured into a bath 220 mounted to a magnetic stirrer 205. Then the substrate 201 on which lead wires were connected to the conductive thin-film pads 203a, 203b was immersed into the dispersion solution 202 in the bath 220. The lead wires were connected to electrode terminals of the DC constant voltage source 8 via a polarity-changeover switch 208 outside the bath 220.

After the above preparation of the electrophoresis apparatus, the magnetic stirrer 205 was put into operation so as to make the superconducting fine powder in the dispersion solution 202 uniformly dispersed. In this state, first the substrate 201 was connected to a power supply 204 whose voltage was set to 100 V so as to make the pad 203a to a negative potential and the pad 203b to a positive potential, and kept as it was for 5 minutes, thereby allowing the superconducting fine powder dispersed in acetone to be deposited on the conductive thin-film electrode 206a and the pad 203a by electrophoresis. Successively, the switch 208 was changeovered so as to switch the connection between the lead wires and the terminals of the power supply 204 whose voltage was set to 100V to make the pad 203a to a positive potential and the pad 203b to a negative potential, and kept as it was for 5 minutes, thereby allowing the superconductive fine powder to be deposited on the conductive thin-film electrode 206b and the pad 203b similarly to the above-mentioned manner.

The substrate 201, having the superconducting fine powder deposited on the conductive thin films as above, was subjected to a heat treatment including the steps of sintering the superconducting fine powder by heat-treating the substrate 201 in air at 900° C. for 3 hours, successively controlling the oxygen composition ratio by holding it at 450° C. for 3 hours, and thereafter gradually cooling it to room temperature, thereby preparing an oxide superconducting coating. The thickness of the oxide superconducting coating formed by the above conditions was 10 $\mu$m. Moreover, a high-precision superconducting coating could be formed in accordance with the pattern of the conductive thin-film electrodes 206a, 206b, which are of fine patterns.

Figure 12:
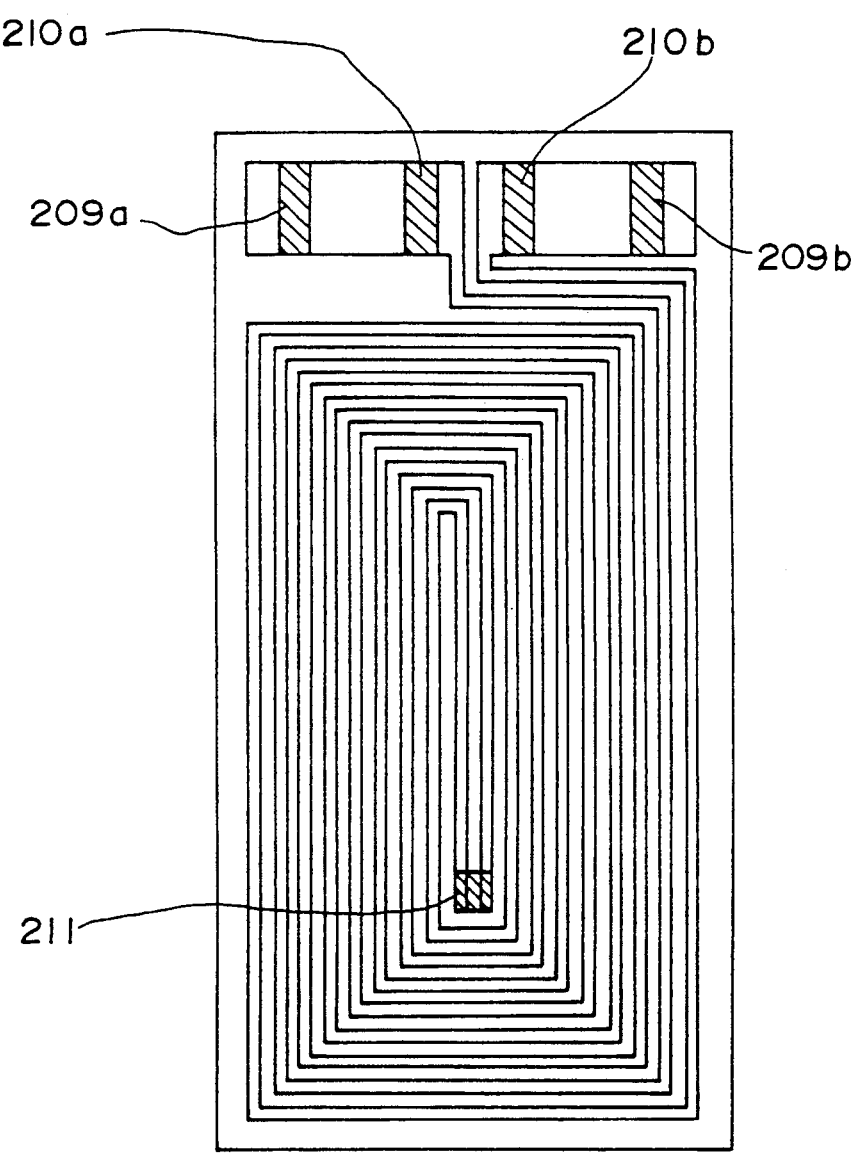
FIG. 12 is a plan view showing a superconducting device formed with a superconducting coating on a substrate.
Figure 13:
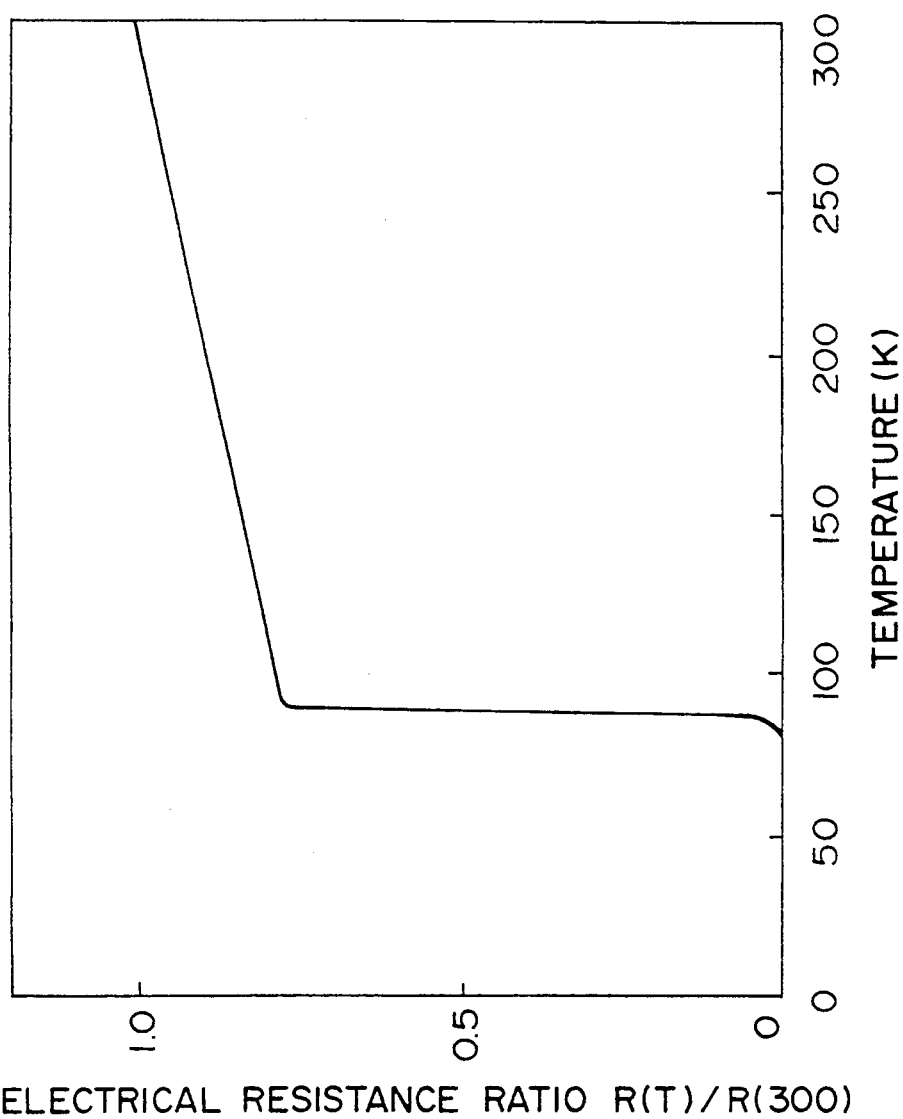
FIG. 13 is a view showing the temperature dependency of electrical resistance of the oxide superconducting coating formed according to the thirteenth embodiment.

To the superconducting coating prepared as above, as shown in FIG. 12, on the patterns 203a, 203b there were formed current electrodes 209a, 209b, voltage electrodes 210a, 210b, and a connecting portion 111 for superconducting coating by a Ti vacuum deposition method using a metal mask. Ag pasted measuring lead wires were connected to these Ti thin-film electrodes 209, 210 for connecting lead wires. The temperature dependency of electrical resistance values of the oxide superconducting coating prepared by a normal four-terminal method using the four lead wires was measured and the results is shown in FIG. 13. In the figure, the horizontal axis represents temperature (K) and the vertical axis represents electrical resistance in its ratio to the value for 300K. As understood from FIG. 13, the superconducting coating prepared in this embodiment proved that the critical temperature is 85K at which its electrical resistance becomes zero.

It was also found that the resulting superconducting coating is of precision shape in accordance with the conductive thin film formed on the substrate. This verified that the method for fabricating superconducting coatings according to the present invention is suitable for making precision patterned coatings of oxide superconducting materials having objective grain boundaries depending on fabricating conditions.

Referring to the comparative example, in which the conditions were the same as in the thirteenth embodiment except that there were provided conductive thin films 203a, 206a on the insulating substrate 207 used in the above thirteenth embodiment and that there were further provided positive-potential conductive electrodes so as to be opposed thereto, which is a conventional electrophoresis, the resulting superconducting coating proved not to be in accordance with the pattern of the thin film 203a, but to have turbulence in the applied electric field in the vicinity of the pad 203a, which it can be considered has been caused by intrusion thereof, resulting in reduced precision of pattern shape.

In the above comparative example, it can be assumed that even if a fairly high voltage is applied between the electrodes oppositely provided on the substrate, the spacing between the electrodes results in a larger one as compared with the thirteenth embodiment while the voltage gradient therebetween results in a smaller one so that there arises an intrusive electric field in proximity to the conductive film, thus causing a deposition of fine powder therealong.

In contrast to the above comparative example, it was verified that the method of the present invention as described in conjunction with the thirteenth embodiment is so arranged that a voltage for electrophoresis is applied between conductive thin films provided close to each other, and therefore the applied voltage concentrates in the vicinity of the thin films with the electric field gradient greater, not causing the electric field to expand, and thus suitable for fabricating high-precision pattern superconducting coatings with high densities.

Further, it was verified that it is possible to make electrodeposition of electrophoresis also with application of using the conductive thin films in the thirteenth embodiment as electrodes. This thirteenth embodiment employed a method in which a sinusoidal-wave AC of 2.0 V effective voltage at 0.1 Hz was applied, whereby the superconducting fine powder by electrophoresis was deposited on both the conductive films. The electrophoresis by AC voltage enables improvement of coating efficiency and coating quality by improving the fabrication conditions.

Although, in the thirteenth embodiment of the present invention as described above, the superconducting coating of electrophoresis was deposited only with the conductive thin films on a piece of insulating substrate, it is also possible to provide opposing electrodes which have conventionally been used in addition to the above ones, for example, when the superconducting coating to be fabricated is not only of linear shape or when it is desirable to use the fine powder of dispersion solution to more efficiency.

Furthermore, the material of the conductive films on the insulating substrate used in the thirteenth embodiment may be platinum (Pt), copper (Cu), or the like without being limited to silver (Ag).

As the conditions for fabricating oxide superconducting coatings of the present invention have been described referring to the thirteenth embodiment up to now, the present invention is not limited to embodiments, and it is permissible to properly control the conditions such as the method for preparing superconducting fine powder, strength of electric field applied between the electrodes, which is a condition for depositing the superconducting fine powder by electrophoresis, and concentration and depositing time and other conditions of the fine powder in the dispersion solution, so that the resulting oxide superconducting coatings will have characteristics matching any intended usage. Furthermore, the superconducting fine powder to be used is also not limited to the fine powder of $Y_1Ba_2Cu_3O_{7-x}$ composition prepared by the solid reaction method in the embodiments, but may be one prepared by the coprecipitation method or spraying method, for example. Further, the oxide superconducting substance is not limited to the Y-series one in the thirteenth embodiment, and Bi-Sr-Ca-Cu-O series, Ti-Ba-Ca-Cu-O series, or other series one, as well as a compound superconducting substance such as Nb or V also can form superconducting coatings having the same effect by processing that can provide weak bond in the surface of the fine powder. In addition, the material for the insulating substrate may be MgO, $SrTiO_3$ and the like without being limited only to YSZ. As shown above, modifications or changes in embodiments are possible within the scope that allows the effect of the present invention to be obtained.

The method of the present invention as described in conjunction with the thirteenth embodiment is so arranged that a voltage for electrodepositing superconducting fine powder by electrophoresis is applied between conductive two thin films provided close to each other, and thus the patterns of minute superconducting coatings can be formed with high precision. Also, by switching the polarity of the applied voltage, there can be formed superconducting coatings o both the conductive thin films, enabling effective use of the insulating substrate. Moreover, there can be formed weak bond in grain boundaries of the formed superconducting coatings, thus facilitating the making of various devices in sueerconducting electronics.

(Fourteenth embodiment)

Now the method for fabricating superconducting coatings of the fourteenth embodiment of the present invention is described in detail below.

First, the procedure for preparing a dispersion solution 302 (shown in FIG. 15) used for forming a superconducting coating by electrophoresis is described. In this case, a superconducting coating having a composition of $Y_1Ba_2Cu_3O_{7-x}$ is fabricated which is called Y-series high-temperature oxide superconducting material.

First, $Y_2O_3$, $BaCO_3$, and $CuO$ powder materials (purity: each 99.99% or more) were weighed so as to obtain a Y - Ba - Cu element ratio of 1:2:3, and mixed sufficiently. Then the result was heat-treated in air at 900° C. for 5 hours, thereby synthesizing an oxide. The resulting oxide was successively subjected to pulverization and mixing, and thereafter the resulting powder was formed into a pellet (diameter: 9 mm, thickness: 1 mm) by applying a pressure of 1500 kg/cm² with a press machine. The formed pellet was heat-treated in air at 950° C. for 5 hours, and thereafter pulverized again into a fine powder. After the fine powder was heat-treated by holding it in air at 950° C. for 3 hours, it was made to pass through a screen mesh to select grain diameters, thereby controlling the grain diameter of the resulting fine powder so as to be approximately 1 μm on the average. In this manner, a superconducting fine powder was prepared by the solid phase reaction method. Then, 0.5 g of the resulting superconducting fine powder was dispersed into 40 ml of acetone, an organic solvent, preparing the dispersion solution 302.

Next, the procedure for preparing a substrate 301 on which a superconducting coating is to be formed.

Figure 14:
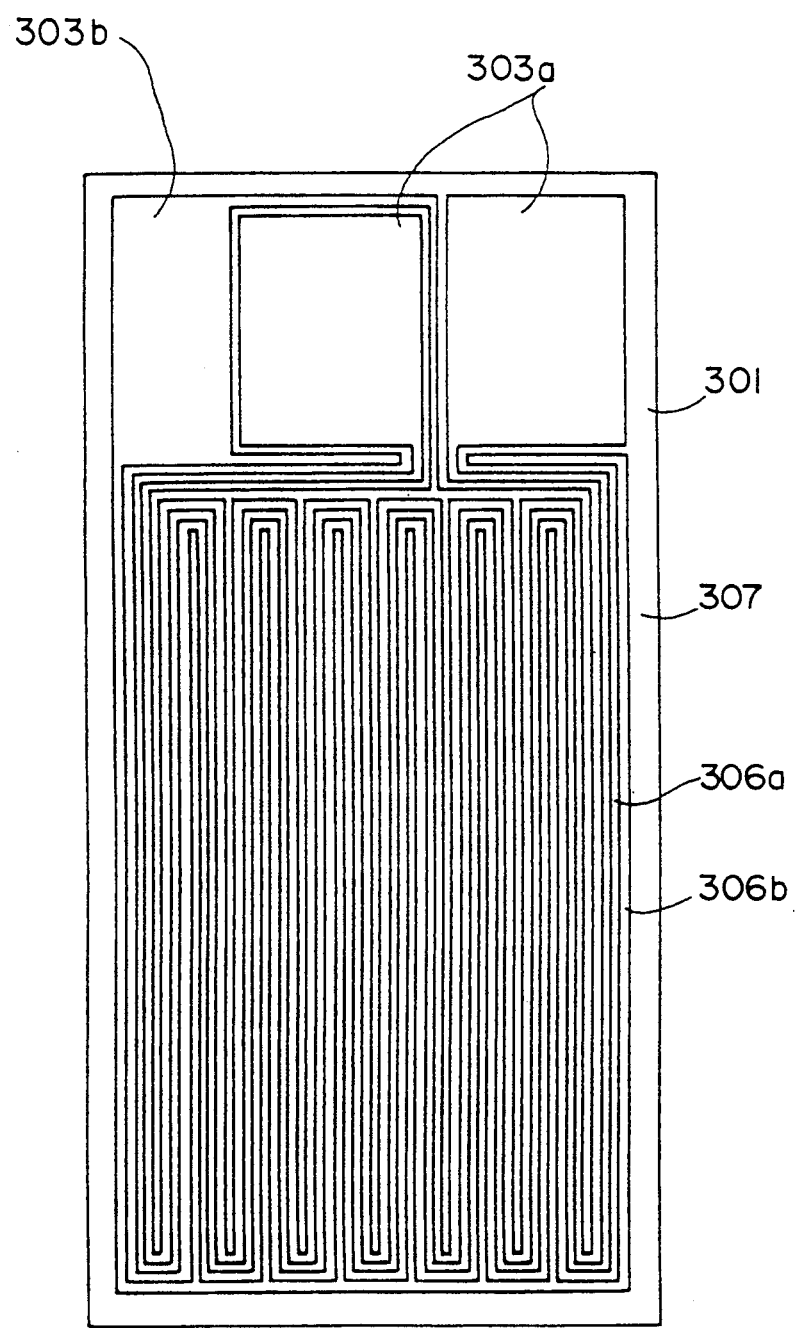
FIG. 14 is a plan view showing a substrate used for deposition.

As shown in FIG. 14, an insulating substrate 307 composed of YSZ (made by stabilizing zirconia ($ZrO_2$) by yttrium (Y)) was first prepared. On this insulating substrate 307, a silver thin film having a film thickness of 200 nm was deposited as a conductive film by the electron beam deposition method. Then, using a mixed solution composed of 55g of iron nitrate, 100 cc of ethylene glycol, and 25 cc of pure water, the deposited silver thin film was processed by the wet etching method so as to form a thin-film electrode 306a and a pad 303a of specified patterns. Resist was applied thereon, a specified opening was provided to the resist, and a silver thin film having a film thickness of 200 nm was deposited as a conductive film. Then unwanted portions of the silver thin film were eliminated by the lift-off method, thus forming a thin-film electrode 306b and a pad 303b (opposing electrode to copper). In this manner, they were formed on the insulating substrate 307 so as to be apart by a specified distance from the thin-film electrode 306a made of silver (Ag) and the thin-film electrode 306b made of copper (Cu) (preparation of the substrate 301). In addition, in this case, the electrode line widths of the thin-film electrode 306a, 306b were 200 μm, 100 μm, respectively, and the distance between the thin-film electrodes 306a and 306b was 100 μm.

Figure 15:
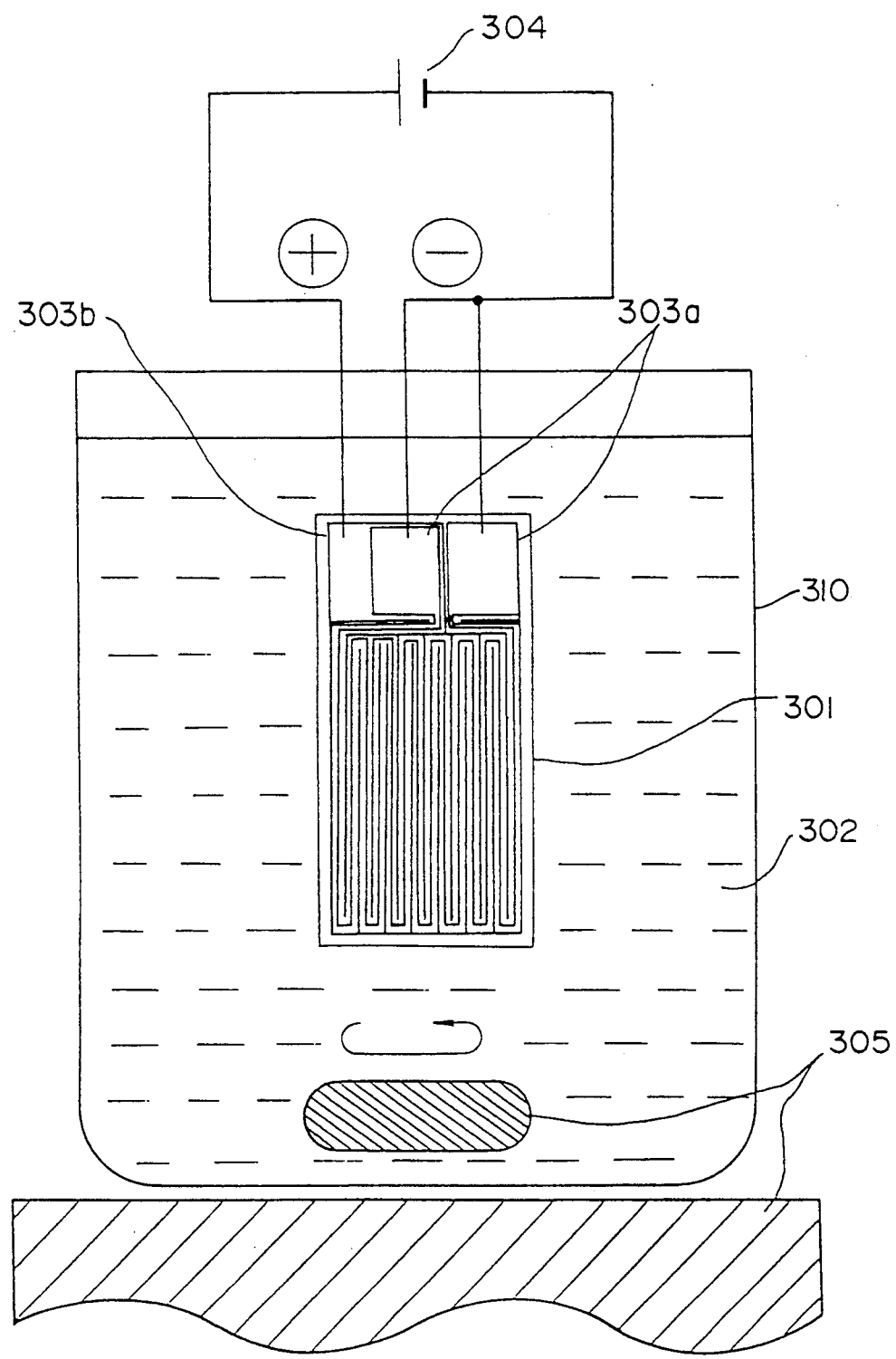
FIG. 15 is a view showing the state in which an oxide superconducting coating is deposited on the aforementioned substrate.

The procedure for forming a superconducting coating on the substrate 301 is as follows:

First, as shown in FIG. 15, the dispersion solution 302 was poured into a bath 310 mounted to a magnetic stirrer 305. Then lead wires were connected to pads 303a, 303b on the substrate 301, and the substrate 301 was immersed into the dispersion solution 302 in the bath 310. The lead wires connected to the pads 303a, 303b were connected to electrode terminals of a DC voltage source 304. Then the magnetic stirrer 305 was made to operate, thereby making the superconducting fine powder in the dispersion solution 302 uniformly dispersed. In this state, a 100 V voltage was applied by the constant voltage source 304 and kept as it was for 20 seconds so as to make the pad 303a to a negative potential and the pad 303b to a positive potential. Thus, the superconducting fine powder in the dispersion solution 302 was deposited on the thin-film electrode 306a and the pad 303a. When this is done, no migration of silver will take place because the thin-film electrode 306b on the positive potential side is made of copper. Accordingly, the superconducting fine powder can be deposited in accordance with the shape of the pattern of the thin-film electrode 306a on the negative potential side. Subsequently, the substrate 301 was taken out of the dispersion solution 302 and subjected to the following heat-treatment. First, the deposited superconducting fine powder was sintered by holding the substrate 301 in air at 900° C. for 3 hours. Then, it was kept at 450° C. for 3 hours thereby to control the oxygen composition ratio, and thereafter gradually cooled to room temperature. Thus the fabrication of the oxide superconducting coating having a composition of $Y_1Ba_2Cu_3O_{7-x}$ was completed.

Actually, the thickness of the oxide superconducting coating formed by the above-described procedure and conditions was 30 μm. Besides, a high-precision superconducting coating has been formed in accordance with the fine pattern of the thin-film electrode 306a. In addition, the thin-film electrode 306b on the negative potential side may also be of another material only if it will not involve migration, permitting gold or platinum to be used therefor.

Figure 16:
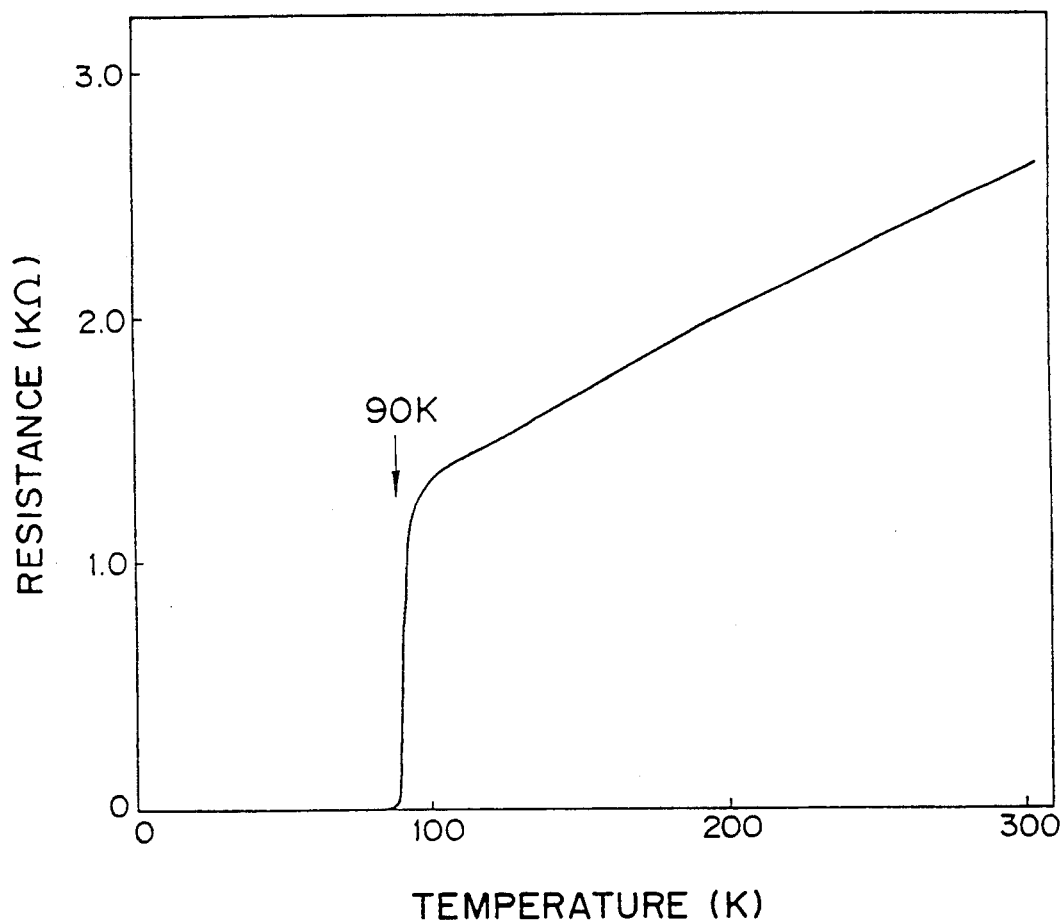
FIG. 16 is a view showing the temperature dependency data of electrical resistance of an oxide superconducting coating formed according to the fourteenth embodiment.
Figure 16:
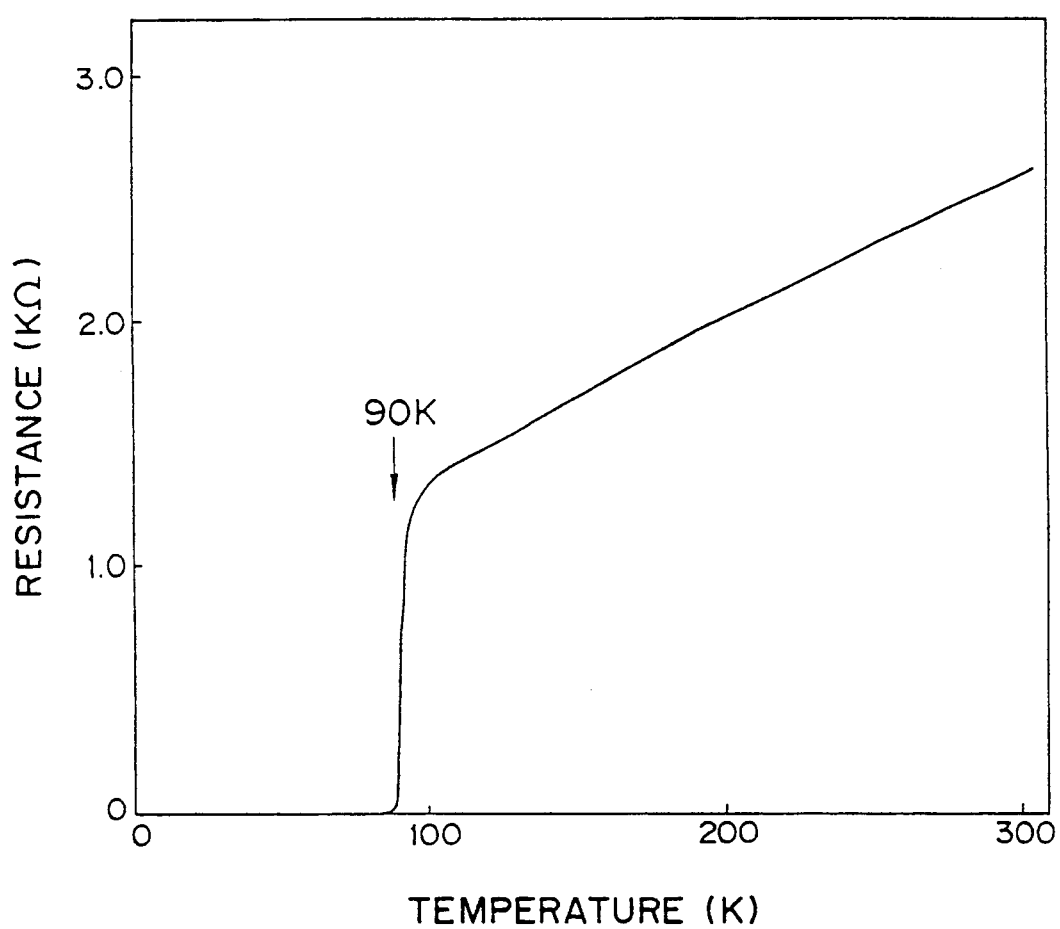
Figure 18:
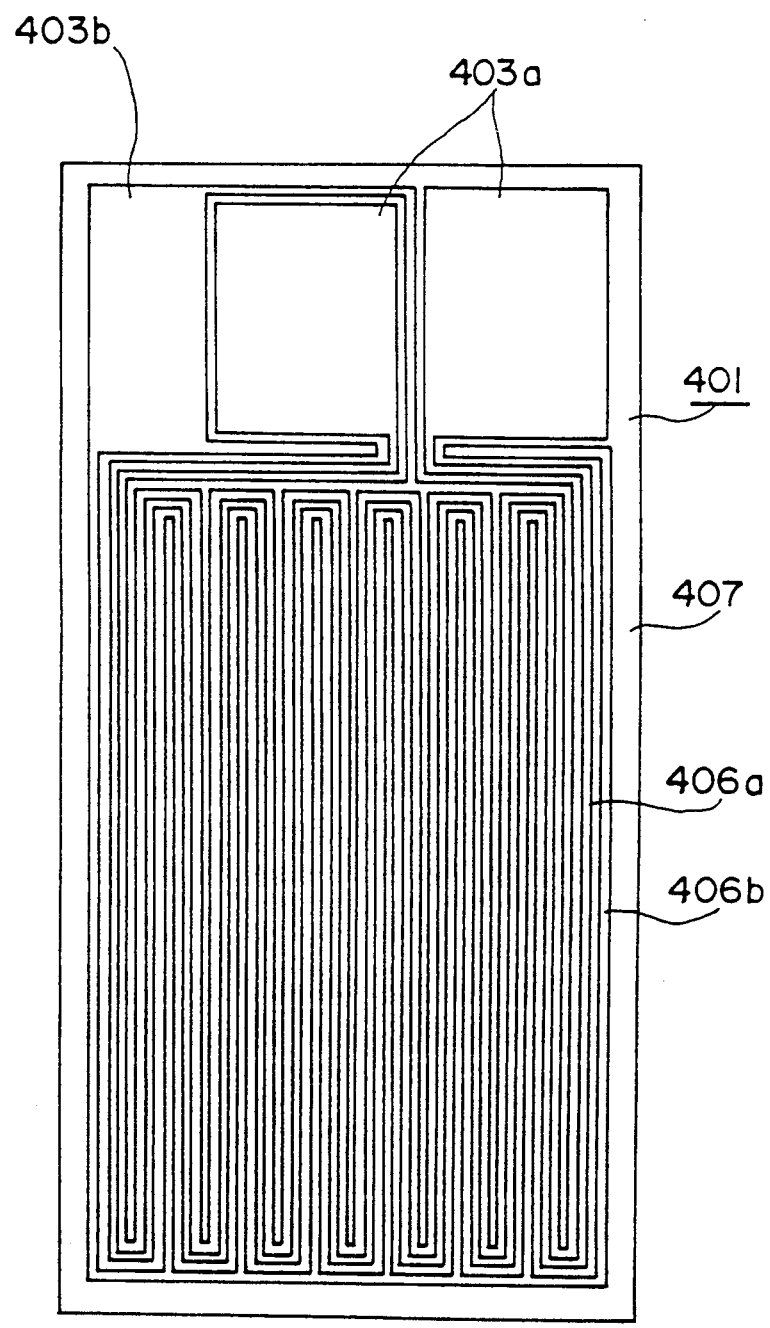
FIG. 18 is a plan view showing a substrate used for deposition.

To measure the superconductivity of the resulting superconducting coating, Ti was mask-deposited by the vacuum deposition method, thereby forming electrodes for connecting lead wires (current electrode and voltage electrode) on the pads 303a, 303b. Moreover, measuring lead wires were connected to the lead wire connection electrodes, each two for one electrode, using Ag paste. Then electrical resistance of the aforementioned oxide superconducting coating was measured by the four-terminal method, obtaining the results as shown in FIG. 16. As understood from FIG. 16 (horizontal axis represents temperature and vertical axis does electrical resistance), the critical temperature Tc of the fabricated superconducting coating was 90K. It was also shown that the deposited superconducting coating is formed in accordance with the shape of the pattern of the thin-film electrode 306a as show in FIG. 14 with high precision, while the thin-film electrode 306a itself flocculates in annealing at 900° C. of the superconducting coating, thus no longer forming a conductive path. Accordingly, as shown in FIG. 17, resistance variation of the superconducting coating due to magnetoresistance could be detected with satisfactory efficiency. The measurement of magnetic reluctance of this superconducting coating was made at 77K liquid-nitrogen temperature, and the current to be flown through the superconducting coating was assigned to its parameter. Thus it was found that the critical temperature Tc of the fabricated superconducting coating is high as much as 90K, and the critical current density is also of appropriate amount. Therefore, it is possible to take a wide range of operating temperature of devices composed using the resulting superconducting coating, allowing enhancement of operating current density. As a result, the variation in magnetic resistance due to the superconducting magnetoresistance can be picked up as a larger level of voltage change than it has been conventionally.

In addition, as a matter of course, it is permissible to optionally change the fabrication conditions of the superconducting fine powder used for electrophoresis and its concentration in the dispersion solution 302 depending on applications of the superconducting coatings. Moreover, it is also possible to properly control the conditions of deposition by electrophoresis such as the strength of electric field applied between the thin-film electrodes 306a, 306b, the distance between electrodes, and depositing time. The superconducting fine powder to be used is not limited to the fine powder having a composition of $Y_1Ba_2Cu_3O_{7-x}$ prepared by the solid-phase reaction method, allowing a fine powder prepared, for example, by the coprecipitation method or spraying method to be used therefor. In addition, the material of the insulating substrate 307 may be MgO, $SrTiO_3$, and the like without being limited only to YSZ.

As apparent from the foregoing description, in the method for fabricating superconducting coatings in the fourteenth embodiment of the present invention, a substrate having a pair of conductive films mounted thereon so as to be juxtaposed apart from each other is immersed into a solvent and, with one of the pair of conductive films is held at a negative potential and the other at a positive potential, the superconducting substance is deposited on the conductive film on the negative potential side, wherein the conductive film on the negative potential side is silver and that on the positive potential side was copper, gold, or platinum. Thus, a superconducting coating having an excellent superconductivity can be fabricated in patterned form with high precision and high densities. Accordingly, it can facilitate the manufacture of various devices in superconducting electronics including magnetic sensors that can detect external feeble magnetic fields with high sensitivity.

(Fifteenth embodiment)

Now the method for fabricating oxide superconducting coatings of the fifteenth embodiment of the present invention is described with reference to the accompanying drawings.

First, the superconducting fine powder and silver oxide powder used for electrodeposition of electrophoresis in the fifteenth embodiment are described. The superconducting fine powder is a composition of $Y,Ba_2Cu_3O_{7-x}$, what is called γ-series high-temperature oxide superconducting material, and was prepared in the following manner.

After $Y_2O_3$, $BaCO_3$, and CuO of high purity material (purity: 99.99% or more) were weighed so as to obtain the Y - Ba - Cu element ratio of 1:2:3, as each element was contained in each material, and sufficiently mixed, they were heat-treated at 900° C. for 5 hours to synthesize an oxide. The synthesized oxide was pulverized and mixed, and the resulting powder was formed into a pellet (diameter: 9 mm, thickness: 1 mm) by applying a pressure of 1500 Kg/cm$^2$ by a press machine. The formed pellet was heat-treated in air at 950° C. for 5 hours and moreover again pulverized into a fine powder, followed by an additional heat-treatment in air at 950° C. for 3 hours. The fine powder prepared as above was selected in grain diameter through a screen mesh to make an oxide superconducting fine powder used for this embodiment, the average grain diameter of the fine powder being controlled so as to be approx. 1 μm on the average. For the silver oxide ($Ag_2O$) fine powder, commercially available one (manufactured by Koujundo Kagaku kenkujo Co., Ltd.) was used.

The Y-series oxide superconducting fine powder prepared as above and the commercial silver oxide fine powder were dispersed into acetone used as an organic solvent. This dispersion solution 402 (shown in FIG. 19) had a dispersion ratio of 0.5 g of the superconducting fine powder and 0.025 g of silver oxide fine powder to 40 ml of acetone, i.e. in a weight ratio of 5 wt. %.

Figure 19:
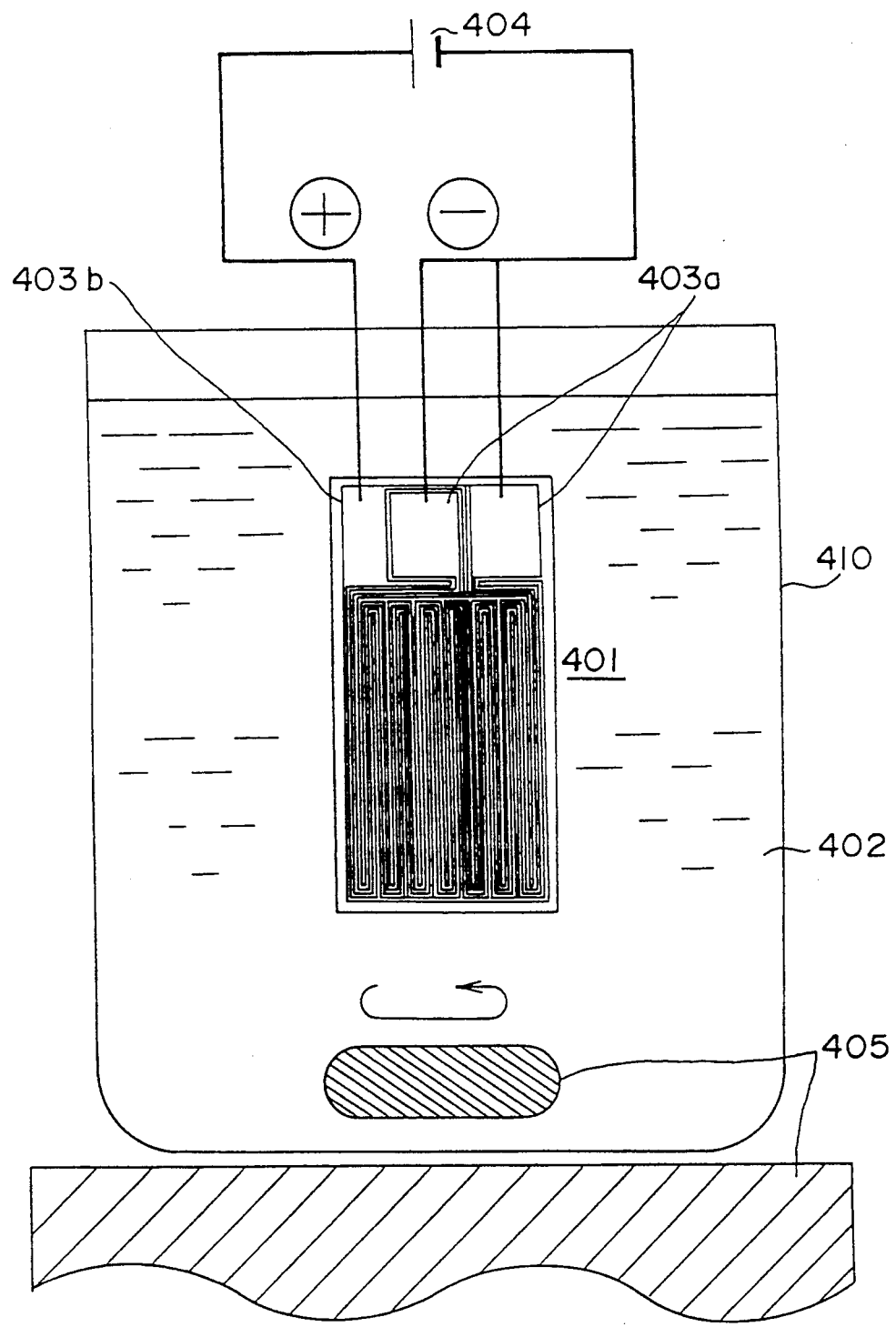
FIG. 19 is a sectional view showing the outline of a deposited film forming apparatus using electrophoresis.

Next, the substrate 401 used in this embodiment was prepared in the following manner. The substrate 401, as its plan view is shown in FIG. 19, has a conductive thin-film electrode 406a of copper (Cu) made into a pattern of superconducting coating to be formed on the surface of a YSZ insulating substrate 407, which is zirconia ($ZrO_2$) stabilized by yttrium (Y), and a conductive thin-film electrode 406b also of copper material spaced apart from the foregoing. To each electrode 406a, 406b there were provided conductive thin-film electrode pads 403a and 403b, respectively. The thin-film electrodes 406a, 406b and pads 403a, 403b were formed by simultaneously patterning 200 nm thick Cu thin films vacuum deposited by electron beam heating by the wet etching method using ferric chloride. In addition, the electrode line widths between the thin-electrodes 406a, 406b were 200 μm and 100 μm, respectively, and the spacing between the electrodes was 100 μm, which were both of fine patterns.

An apparatus for electrodepositing the superconducting fine powder by electrophoresis using the dispersion solution 402 and the substrate 401 prepared as above is outlined in FIG. 19. Referring to FIG. 19, the dispersion solution 402 was poured into a bath 410 mounted to a magnetic stirrer 405. Then the substrate 401 on which lead wires were connected to the conductive thin-film pads 403a, 403b was immersed into the dispersion solution 402 in the bath 420. The lead wires connected to the pads 403a, 403b were connected to the electrode terminals of a DC constant voltage source 404. After the above preparation of the electrophoresis apparatus, the magnetic stirrer 105 was put into operation so as to make the superconducting fine powder and the silver oxide fine powder in the dispersion solution 402 uniformly dispersed. In this state, first the substrate 401 was connected to the DC constant voltage source 404 whose voltage was set to 100 V so as to make the pad 403a to a negative potential and the pad 403b to positive, and kept as it was for 20 seconds, thereby allowing the superconducting fine powder and the silver oxide fine powder dispersed in acetone to be deposited on the conductive thin-film electrode 406a and the pad 403a by electrophoresis. The substrate 401, having the superconducting fine powder and the silver oxide fine powder deposited on the conductive thin films as above, was heat-treated in air at 900° C. for 3 hours thereby to sinter the superconducting fine powder and the silver oxide fine powder. This was followed by a heat treatment including the steps of controlling the oxygen composition ratio by holding the substrate 401 at 450° C. for 3 hours and thereafter gradually cooling it to room temperature, thereby preparing an oxide superconducting coating. The thickness of the oxide superconducting coating formed by the above conditions was 30 μm. Moreover, a high-precision superconducting coating could be formed in accordance with the patterns of the conductive thin-film electrodes 406a, 406b, which were of fine patterns.

Figure 20:
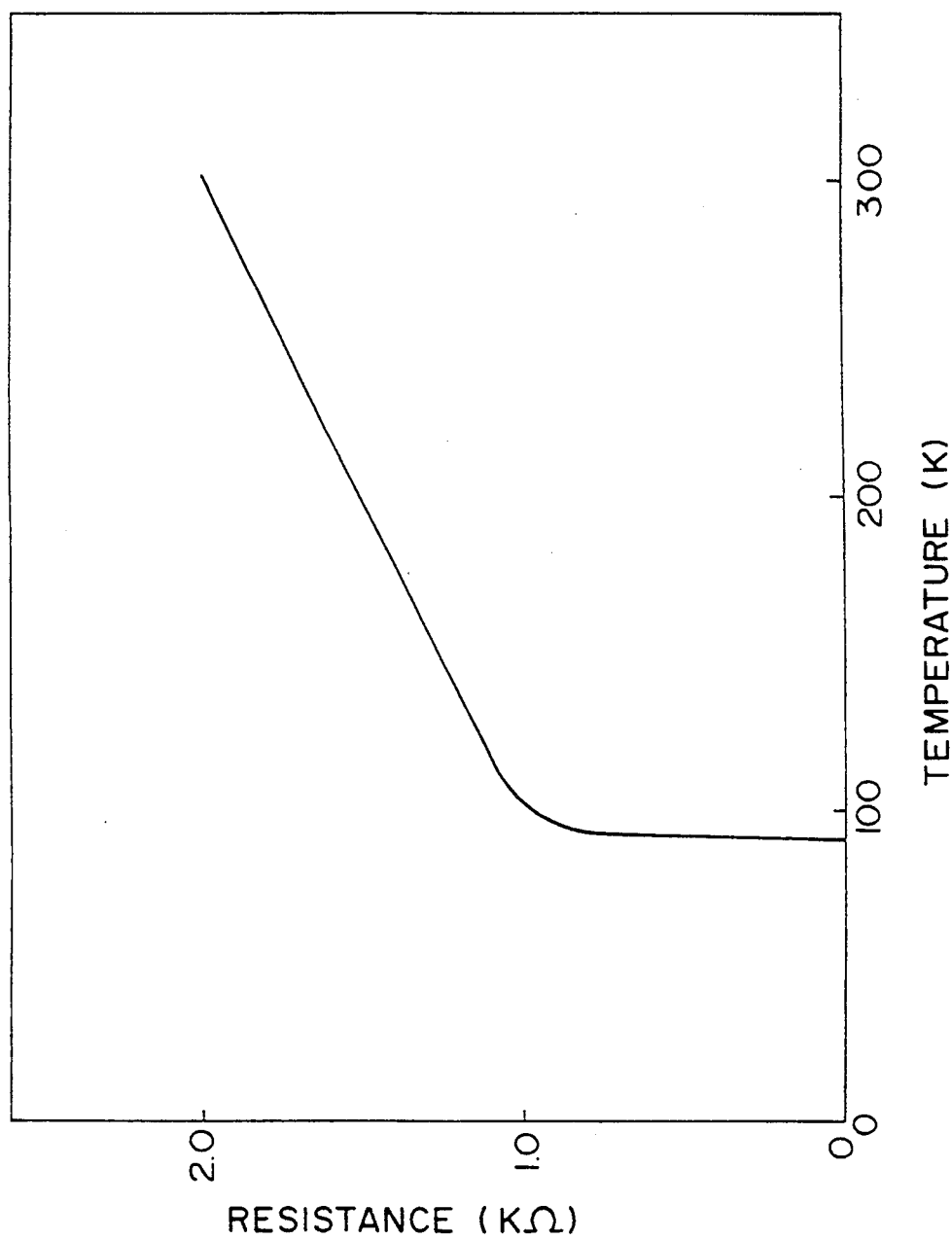
FIG. 20 is a view showing the temperature dependency of electrical resistance of an oxide superconducting coating formed according to the fifteenth embodiment.

To the superconducting coating prepared as above, on the pads there were formed current electrodes, voltage electrodes, and a connecting portion for superconducting coating by a Ti vacuum deposition method using a metal mask. Ag pasted measuring lead wires were connected to these Ti thin-film electrodes for connecting lead wires. The temperature dependency of electrical resistance values of the oxide superconducting coating prepared by a normal four-terminal method using the four lead wires was measured and the results is shown in FIG. 20. In the figure, the horizontal axis represents temperature (K) and the vertical axis represents electrical resistance. As understood from FIG. 20, the superconducting coating prepared in this embodiment proved that the critical temperature is 90K at which its electrical resistance becomes zero.

Figure 21:
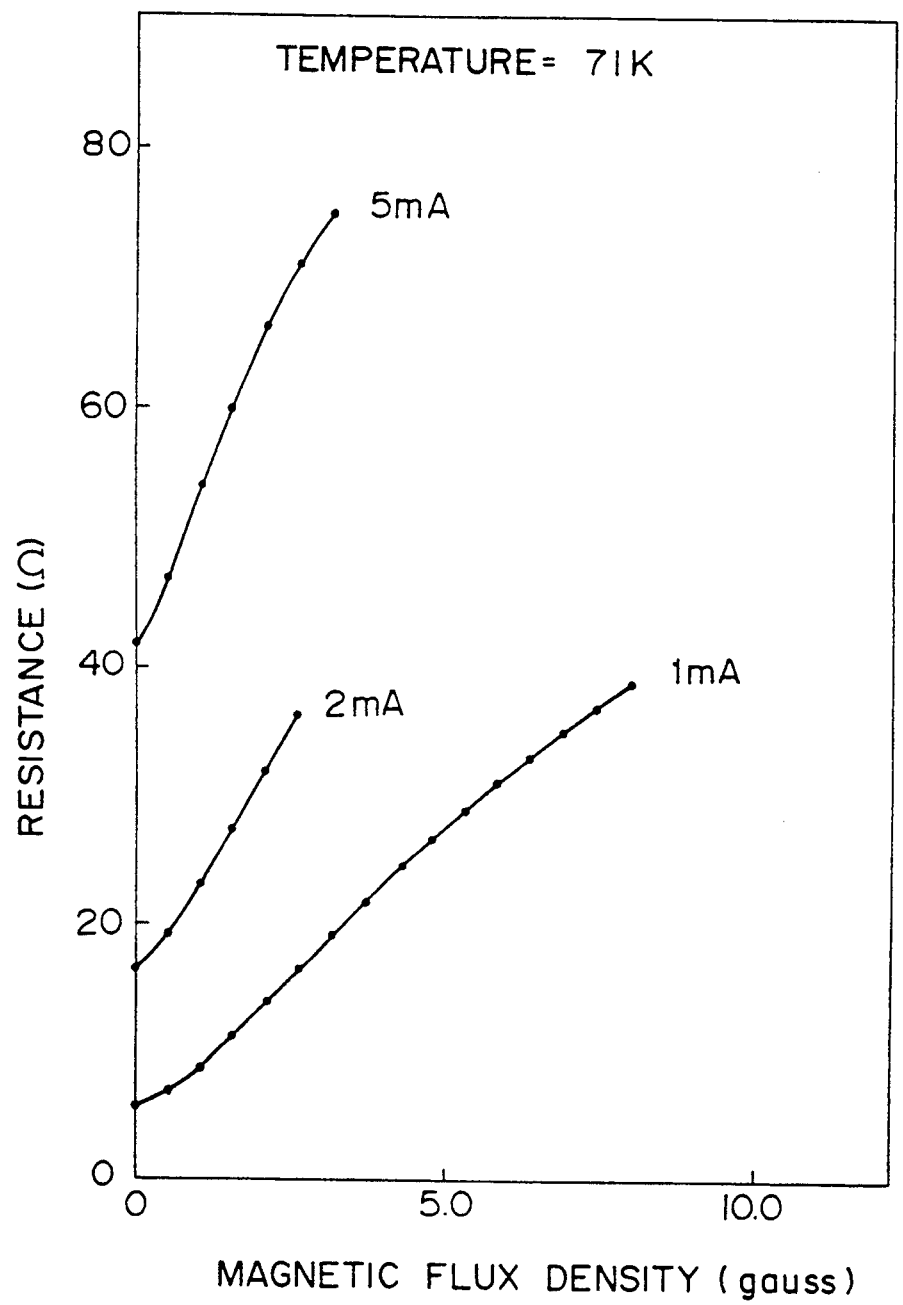
FIG. 21 is a view showing the magnetic characteristic data of the aforementioned oxide superconducting coating.

It was also found that the resulting superconducting coating is of precision shape in accordance with that of the conductive thin film formed on the substrate. Further detailed examination has shown that the copper thin film on which the superconducting coating was formed due to its negative potential was oxidized with a high resistance. This allowed only the superconducting thin film to be conductive, so that the resistance variation due to superconducting magnetoresistance could be detected with high efficiency. The magnetic reluctance characteristic of the superconducting coating prepared as above is shown in FIG. 21. In the figure, measurement was made at a temperature of 71K with a parameter of the current that is made to flow through the superconducting coating. Moreover, its critical temperature $T_{c, end}$ was at high level as much as 90K, providing a wide temperature range for use of the device made with the oxide superconducting coating, while its critical current density was also at proper level such as to allow any magnetic reluctance variation due to superconducting magnetoresistance to be picked up as a larger amount of voltage variation.

As the conditions for preparing oxide superconducting coatings of the present invention have been described referring to the fifteenth embodiment up to now, the present invention is so arranged that, to develop the magnetoresistance due to grain boundaries to a great extent, silver oxide fine powder is added to superconducting fine powder, which is then deposited. Although the ratio at which the silver oxide fine powder is added is limited here, the present invention is not limited to the embodiment, and it is permissible to properly control the conditions such as the method for preparing superconducting fine powder, strength of electric field applied between the electrodes, which is a condition for depositing the superconducting fine powder by electrophoresis, the distance between the electrodes, and concentration and depositing time and other conditions of the fine powder in the dispersion solution, so that the resulting oxide superconducting coatings will have characteristics matching any intended usage. Furthermore, the superconducting fine powder to be used is also not limited to the fine powder of $Y_1Ba_2Cu_3O_{7-x}$ composition prepared by the solid-phase reaction method in the embodiments, but may be one prepared by the coprecipitation method or spraying method, for example. Also, the silver oxide fine powder may be substituted by another prepared by various methods without being limited. In addition, the material for insulating substrate may be MgO, $SrTiO_3$ and the like without being limited only to YSZ. As shown above, it is possible to modify or change the embodiments within the scope that allows the effect of the present invention to be obtained.

As shown in the above description, the method for fabricating superconducting coatings in the fifteenth embodiment of the present invention enables the formation of superconducting coatings having a great magnetoresistance due to grain boundaries in high-temperature superconducting substances, allowing the resulting effects to be taken out with satisfactory efficiency. As a result, the method can facilitates the manufacture of various devices in superconducting electronics including magnetic sensors that can detect external feeble magnetic fields with high sensitivity.

As apparent from the above description, the method for fabricating oxide superconducting coatings of the present invention is such that a substrate on which a copper electrode is formed is immersed into a solution in which an oxide superconducting fine powder is dispersed into an organic solvent, the sintering of a deposited coating of the oxide superconducting fine powder formed on the electrode by electrophoresis is carried out in vacuum or an inert gas atmosphere, and subsequently heat-treatment for controlling the oxygen composition ratio is done in oxygen or in an atmosphere containing oxygen. Therefore, the method can prevent a CuO layer from being formed on the surface of the copper substrate, and enables oxide superconducting coatings having excellent characteristics to be formed on the copper substrate.

Moreover, when the heat-treating temperature for controlling the oxygen composition ratio is under 500° C. and over 300° C., the formation of the CuO layer can be prevented effectively.

Also, the method for fabricating oxide superconducting coatings of the present invention is a method in which an insulating substrate on the surface of which conductive films of specified patterns are formed is immersed into an organic solvent into which an oxide superconducting fine powder is dispersed, the oxide superconducting fine powder is deposited on the conductive film held at a negative potential, and thereafter heat-treatment is carried out, wherein silver thin films are used as conductive films on the insulating substrate. Thus the method can prevent any deterioration of superconducting substances due to oxidation of substrate material.

Further, when the conductive film to be kept at a positive potential for the deposition of the oxide superconducting fine powder is formed in proximity to the patterned silver conductive film on which the oxide superconducting fine powder is deposited, there can be formed an electric field that is concentrated between the positive-potential and the negative-potential conductive films, thus allowing superconducting fine powder to be deposited with high precision of patterns.

Yet further, when the aforementioned deposited superconducting fine powder is annealed in the temperature range of 880° C. to 935° C., it is possible to vanish the normally conduction path by flocculating the above deposited conductive films, thus allowing magnetoresistance and optical response characteristic to be improved.

Also, the method for fabricating oxide superconducting coatings of the present invention is a method in which a conductive film formed into a specified pattern on an insulating substrate is immersed into an organic solvent into which an oxide superconducting fine powder is dispersed and held at a negative potential, the oxide superconducting fine powder is deposited on the conductive film, wherein the aforementioned pattern is two in number, and of such a shape as to be juxtaposed in parallel close to each other, hold-voltage difference between the two conductive films serving for deposition of the superconducting fine powder and moreover hold voltages of the two conductive films being switched. Thus, it is possible to deposit superconducting coatings on both the conductive thin films. Accordingly, taking advantage of the insulating substrate effectively, superconducting coatings can be formed with high density. Moreover, there can be formed an electric field concentrated between both the conductive thin films, thus enhancing the pattern precision.

Also, the method for fabricating oxide superconducting coatings of the present invention is a method in which a substrate having a pair of conductive films mounted thereon so as to be juxtaposed apart from each other is immersed into a solvent into which a material of the superconducting substance is dispersed and, with one of the pair of conductive films is held at a negative potential and the other at a positive potential, the superconducting substance is deposited on the conductive film on the negative potential side, wherein the conductive film on the negative potential side is silver and that on the positive potential side was copper, gold, or platinum. Thus, a superconducting coating having an excellent superconductivity can be fabricated in patterned form with high precision and high densities. Accordingly, it can facilitate the manufacture of various devices in superconducting electronics including magnetic sensors that can detect external feeble magnetic fields with high sensitivity.

Yet also, the method for fabricating oxide superconducting coatings of the present invention is a method in which a conductive film formed into a specified pattern on an insulating substrate is immersed into an organic solvent in which a superconducting fine powder is dispersed and held at a negative potential, and the superconducting fine powder is deposited on the conductive film, wherein silver oxide fine powder is added into the organic solvent in which the superconducting fine powder is dispersed. Thus, a superconducting coating having a ceramic structure composed of fine particles can be formed and magnetic reluctance characteristic and optical response characteristic of the superconducting coating can be improved.

In addition, when the aforementioned silver oxide fine powder is dispersed into the organic solvent at a ratio of 0.5 to 10% by weight to the superconducting fine powder, the magnetic reluctance characteristic and optical response characteristic of the resulting superconducting coating can be enhanced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

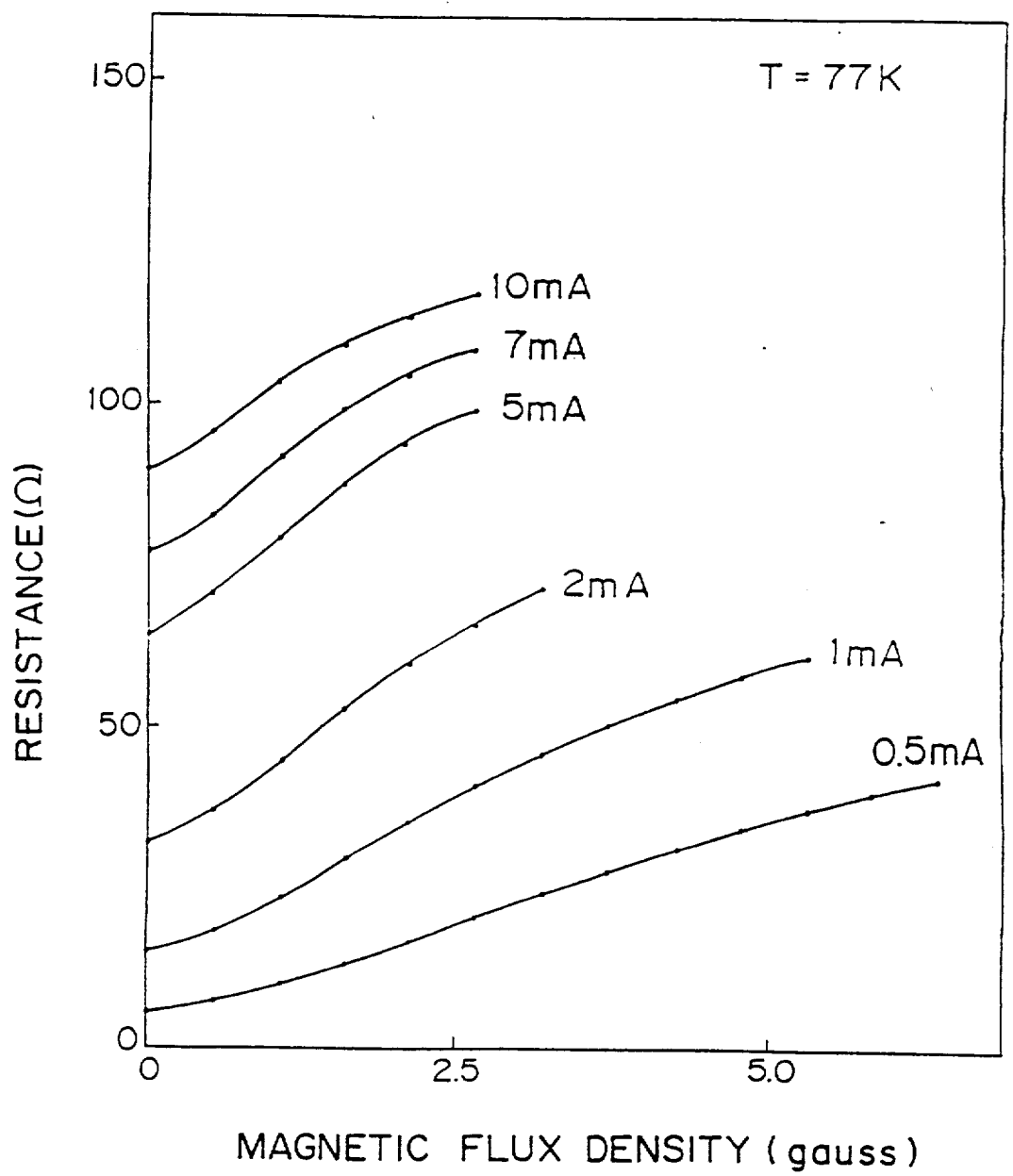

What is claimed is:

1. A method for fabricating oxide superconducting coatings comprising the steps of:

immersing a substrate having a copper electrode formed thereon into a solution comprising an oxide superconducting fine powder that is dispersed in an organic solvent;

sintering a deposited film of said oxide superconducting fine powder formed on said electrode by electrophoresis in a vacuum or an atmosphere of an inert gas; and subsequently heat-treating the sintered film so as to control an oxygen composition ratio in an atmosphere of oxygen or in an atmosphere containing oxygen.

2. The method for fabricating oxide superconducting coatings as claimed in claim 1, wherein the heat-treatment temperature for controlling the oxygen composition ratio is under 500° C. and over 300° C.

3. The method for fabricating superconducting coatings as claimed in claim 1, wherein said superconducting fine powder comprises a Y-Ba-Cu-O series oxide superconducting fine powder.

4. The method for fabricating superconducting coatings as claimed in claim 2, wherein said superconducting fine powder comprises a Y-Ba-Cu-O series oxide superconducting fine powder.

* * * * *

UNITED STATES PATENT AND TRADEMARK OFFICE
CERTIFICATE OF CORRECTION

PATENT NO. : 5,219,828

DATED : June 15, 1993

INVENTOR(S) : Shintaku et al.

It is certified that error appears in the above-identified patent and that said Letters Patent is hereby corrected as shown below:

IN THE DRAWINGS:

Sheet 17 should be deleted to be replaced with the attached sheet.

Signed and Sealed this

Twenty-seventh Day of December, 1994

Attest:

BRUCE LEHMAN

*Attesting Officer*   *Commissioner of Patents and Trademarks*